(12) United States Patent
Léonard et al.

(10) Patent No.: US 10,684,346 B2
(45) Date of Patent: Jun. 16, 2020

(54) ONLINE CALIBRATION OF METERS AND DETECTION OF ELECTRICAL NON-COMPLIANCES

(71) Applicant: HYDRO-QUÉBEC, Quebec (CA)

(72) Inventors: François Léonard, Quebec (CA); Arnaud Zinflou, Quebec (CA); Mathieu Viau, Quebec (CA); Alexandre Bouffard, Quebec (CA)

(73) Assignee: HYDRO-QUÉBEC, Quebec (CA)

( * ) Notice: Subject to any disclaimer, the term of this patent is extended or adjusted under 35 U.S.C. 154(b) by 110 days.

(21) Appl. No.: 16/095,427

(22) PCT Filed: Apr. 12, 2017

(86) PCT No.: PCT/CA2017/050448
§ 371 (c)(1),
(2) Date: Oct. 22, 2018

(87) PCT Pub. No.: WO2017/181272
PCT Pub. Date: Oct. 26, 2017

(65) Prior Publication Data
US 2019/0137592 A1    May 9, 2019

(30) Foreign Application Priority Data

Apr. 20, 2016  (CA) ...................................... 2927482

(51) Int. Cl.
*G01R 35/04*    (2006.01)
*G01R 22/06*    (2006.01)

(52) U.S. Cl.
CPC ........... *G01R 35/04* (2013.01); *G01R 22/066* (2013.01); *G01R 22/068* (2013.01)

(58) Field of Classification Search
CPC ........ G01R 35/04; G01R 22/06; G01R 21/00; G01R 1/00
See application file for complete search history.

(56) References Cited

U.S. PATENT DOCUMENTS

| 4,766,370 A | * | 8/1988 | Carr | ....................... G01R 35/04 324/130 |
| 9,013,173 B2 | | 4/2015 | Veillette | |

(Continued)

FOREIGN PATENT DOCUMENTS

| CN | 102621516 A | 8/2012 |
| CN | 102928809 A | 2/2013 |

(Continued)

OTHER PUBLICATIONS

Sergio Salinas, et al., "Privacy-Preserving Energy Theft Detection in Smart Grids: A P2P Computing Approach," IEEE Journal on Selected Areas in Communications/Supplement, vol. 31, No. 9, Sep. 2013.

(Continued)

*Primary Examiner* — Alvaro E Fortich
*Assistant Examiner* — Zannatul Ferdous
(74) *Attorney, Agent, or Firm* — Muirhead and Saturnelli, LLC

(57) ABSTRACT

The disclosed method corrects consumption measurements provided by meters presumed to be connected to a same network. The measurements taken by the meters at time intervals are collected in a form of samples used to determine electrical quantities in relation with currents and voltages relating to the meters. A selection of a group of retained samples among the samples considered to be valid, corresponding to a load range or a range of load variation ratio carried by the network based on the electrical quantities is performed. Correction functions of the consumption measurements are defined from the group of retained samples, and the consumption measurements are adapted according to the correction functions. An anomaly corresponding to an electrical non-compliance of a meter can be detected by the method.

20 Claims, 11 Drawing Sheets

(56) References Cited

U.S. PATENT DOCUMENTS

| | | | |
|---|---|---|---|
| 2005/0102068 A1* | 5/2005 | Pimputkar | H02J 3/14 700/291 |
| 2006/0095219 A1* | 5/2006 | Bruno | G01R 19/02 702/64 |
| 2013/0191051 A1 | 7/2013 | Stocker et al. | |
| 2015/0153153 A1 | 6/2015 | Premm et al. | |
| 2015/0241488 A1 | 8/2015 | Sonderegger | |
| 2016/0117326 A1 | 4/2016 | Steigler | |
| 2016/0154389 A1* | 6/2016 | Drees | G05B 13/048 700/291 |
| 2017/0010595 A1* | 1/2017 | Kawaguchi | H02J 13/00 |

FOREIGN PATENT DOCUMENTS

| | | |
|---|---|---|
| WO | WO 2016/178998 A1 | 11/2016 |
| WO | WO 2016/179005 A1 | 11/2016 |
| WO | WO 2016/206191 A1 | 12/2016 |

OTHER PUBLICATIONS

Sergio Salinas, et al., "Privacy-Preserving Energy Theft Detection in Smart Grids," 2012 $9^{th}$ Annual IEEE Communications Society Conference on Sensor, Mesh and Ad Hoc Communications and Networks (SECON).

Chun-Lien Su, et al., "Electricity Theft Detection in Low Voltage Networks with Smart Meters Using State Estimation," IEEE, 2016.

\* cited by examiner

ONLINE CALIBRATION OF METERS AND DETECTION OF ELECTRICAL NON-COMPLIANCES

FIELD OF THE INVENTION

The invention generally relates to a method for processing consumption measurements provided by meters presumed to be connected to a same network, and in particular to a method for correcting the consumption measurements and a computer system executing the method. The method especially allows an online calibration of the meters and a detection of electrical non-compliances (ENCs).

BACKGROUND

The typical accuracy specification of a meter is of ±0.5% (Class 5) or of ±0.2% (Class 2) thus, for example, of ±1.25 V and ±0.5 V respectively for a 250 V voltage reading. Such a voltage variation observed for a short connection having a resistance of 10 mΩ respectively corresponds to a variation of current of 125 A and 50 A in this connection. An absolute voltage reading of a meter, used alone, allows a priori only detecting electrical non-compliances exhibiting high levels of voltage deviations. According to a meter-to-meter differential view, the comparison of the voltage of a meter with the other meters sharing the same low-voltage network may indicate lower level anomalies. For this purpose, it would be useful to be able to correct the voltage measurement calibration divergences between meters connected to a common network to allow a more accurate detection of anomalies. According to a time-differential view for a same meter, the voltage variations related to the variations of load currents contain relevant information for detecting non-compliances. US 2015/0241488 (Sonderegger) proposes a method using a linear regression for linking the voltage variations to the variations of current measured by a meter and inferring an impedance correlation thereof. An abnormally high impedance may indicate a bypass. Also, it is mentioned that a low convergence of the regression is an indicator of a bypass used only a part of the day. The method has the disadvantage of considering only the voltage variation of a meter as a function of its consumption regardless of the other voltages and consumptions of the other meters, so that it mixes two resistance values, namely the network resistance and the meter-to-network connection resistance. It has been discovered in the context of the present invention that these two resistance values, and also their dispersion, are altered differently depending on the type of ENCs present. It would be desirable to have a more accurate method than those known in the prior art, the method also being able to provide a means for detecting load manipulations that may lower the apparent connection resistance of a meter so as to deceive certain prior art methods as that proposed in US 2015/0241488 (Sonderegger). US20130191051 (Stocker et al.), US20160117326 (Steigler) and U.S. Pat. No. 9,013,173 (Veillette) provide examples of other prior art methods.

SUMMARY

According to an embodiment of the invention, there is provided a method for correcting, by a processor with a memory, consumption measurements taken at time intervals by a set of meters presumed to be connected to a same network, the method comprising the steps of:

(i) collecting the consumption measurements and storing them in the memory in a form of a set of samples time-classified according to the time intervals of taking the consumption measurements by the meters;

(ii) validating, by the processor, the samples in memory according to predetermined validation criteria;

(iii) determining, by the processor, electrical quantities in relation with currents and voltages respectively relating to the meters for each time interval from the samples considered to be valid;

(iv) selecting, by the processor, a group of retained samples among the samples considered to be valid, that correspond to a load range or a range of load variation ratio carried by the network based on the electrical quantities determined in (iii);

(v) defining, by the processor, correction functions of the consumption measurements from the group of retained samples selected in (iv); and (vi) adapting, by the processor, the consumption measurements according to the correction functions defined in (v).

According to another embodiment of the invention, there is provided a system for correcting consumption measurements provided by meters presumed to be connected to a same network, the system comprising a processing unit having a processor and a memory in communication with the processor, the memory containing instructions that, when executed by the processor, cause the processor to perform the steps of the above-described method.

The following provides an outline of certain possibly preferable features of the invention which are to be considered non-restrictively and which will be more fully described hereinafter.

According to an embodiment of the present invention, there is proposed an online relative calibration method of meters, i.e. when the meters are in operation connected on the network. The purpose of the calibration is to correct the voltage reading errors between the meters sharing a same low-voltage network, which appear to be static and systematic through time with a non-zero mathematical expectation due to a calibration bias. For each reading or measurement time step of the meters, the total current carried or the maximum of current carried on the network is calculated to select a group of samples formed of electrical quantities taken from the meter measurements corresponding to a predetermined load range. In a preferred embodiment, the load range is comprised between a minimum to exclude possibly invalid samples and a maximum in order to obtain a sufficient group population of samples corresponding to a small load. A calculation of voltage calibration coefficients is then achieved form the group. A non-calibrated average voltage for each meter and a dispersion of the instantaneous voltage time-observed for each meter are calculated using the samples of the group in order to detect an anomaly that may correspond to an electrical non-compliance. A possible refinement consists of calculating three resistance values, namely a network resistance, an apparent connection resistance and a total resistance, along with dispersion values on the resistance estimates. The network resistance of a meter is estimated from the time variation of the average voltage of the meters and the variation of current of the same meter for a set of samples that may be different from the group of retained samples. The total resistance is estimated from the time variation of the voltage of the meter and the variation of current of the same meter for the same set of samples used for the calculation of the network resistance. The connection resistance is the difference between the total resistance and the network resistance. The connection resistance is used to correct the voltage drop of each meter for the group of retained samples in order to define more precisely the calibration coefficient values. The voltage drop in the connection of a meter is usually generated by the current measured on the latter when the electrical installation is compliant. For the detection of a non-compliance, the presence of an abnormal value of one of the resistances or of an abnormal dispersion of a resistance value through time is detected. The online calibration of the meters allows for more accurate modeling of the network and also has a metrological function by identifying the off-specification meters. It should be noted that a constant bias in a voltage measurement is reflected in the same proportion in a measurement of current since both measurements are compared to the same voltage reference by a sigma-delta converter usually equipping a meter. The selection of a group may also be produced from the derivative of the current in which case the observation of statistical deviations of the voltage derivative informs about the presence of ENCs.

A more precise comparison of the meter voltages from a group determined by the consumptions of all the meters with the voltage drops corrected with regard to the consumption of each meter may be obtained with the method according to the invention.

In a possible refinement, the load range determining the group is replaced by a range of load variation ratio, the ratio being the sum of the quadratic load variations of the other meters over the square of the load variation of the meter under examination. As the selected sample group corresponds to times when the meter under examination stands out the most due to its activity, a counting may be carried out for the times when the voltage variation of this meter does not level-match the variation of current carried by the meter. An annual count exceeding ten means a probable presence of a load switching between the upstream and downstream of the meter.

BRIEF DESCRIPTION OF THE DRAWINGS

A detailed description of preferred embodiments will be given herein below with reference to the following drawings.

DETAILED DESCRIPTION OF THE PREFERRED EMBODIMENTS

In the context of this disclosure, an electrical anomaly attributable to an electricity theft (two-phase network with neutral) may be defined as follows.

Figure 1:
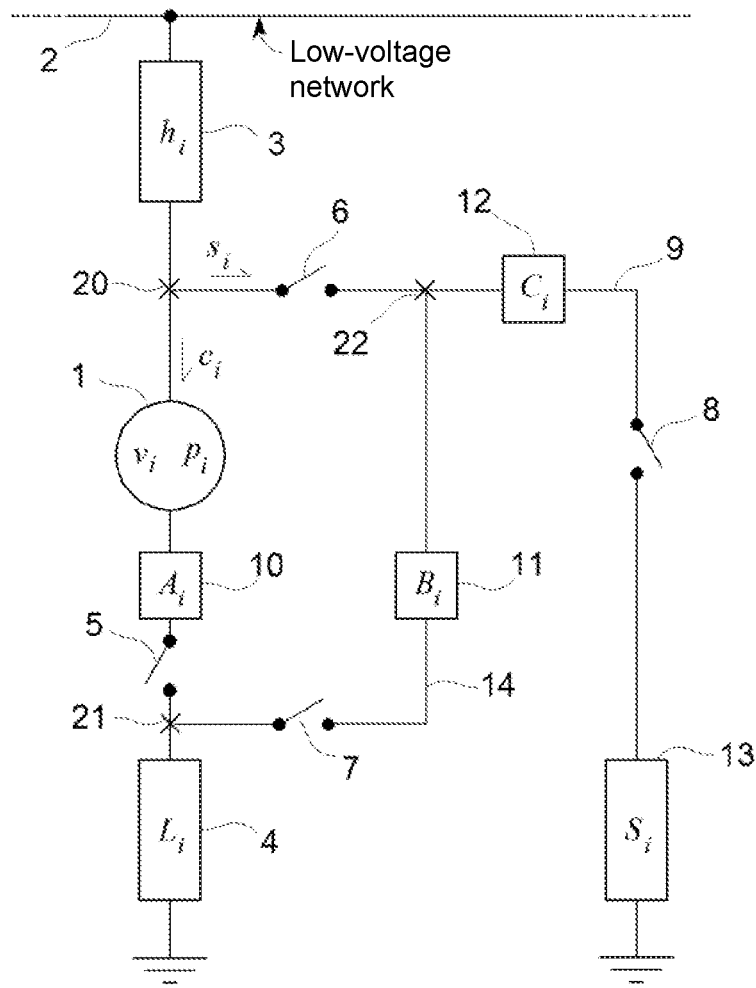
FIG. 1 illustrates a generic and non-exhaustive example of electricity theft where by action of different switches, different types of electricity thefts are performed.

Referring to FIG. 1, a meter "i" 1 is connected to a low-voltage network 2 by a connection 3 having a resistivity $h_i$. This meter and its circuit connecting it to a distribution panel (not illustrated) has an internal resistance $A_i$ 10 and supplies a load $L_i$ 4 switched in the distribution panel by a circuit-breaker 5 (or switch).

Insertion of a circuit made up of at least two illegal connections connecting the upstream of the meter 1 to a circuit on its downstream side will be called a "bypass". For the general example illustrated in FIG. 1, a connection 20 upstream of the meter 1 and a connection 21 downstream of the distribution panel form a bypass when the switch 5 and switches 6 and 7 are nonexistent or closed and a switch 8 is in open circuit or there is no branch circuit 9. The connection 21 may also be located between the meter 1 and the distribution panel or be connected to more than one circuit supplied by the distribution panel. A switch in position 6 or 7 may also be present and often closed at the same time as the switch 5 is opened when the person responsible for the electricity theft is on-site. In bypass mode, when the switches 5, 6 and 7 are closed, the stolen current over the measured current ratio is given by the circuit resistance $A$ 10 over the circuit resistance $B_i$ 11 ratio. Given the small value of the resistance $A_i$ 10, the theft ratio usually does not much exceed the unity.

Insertion of a circuit between the upstream of the meter 1 and a load not supplied by the meter 1 will be called "diversion". For the general example illustrated in FIG. 1, the connection 20 upstream of the meter 1 which supplies a load 13 forms a diversion when the switches 6 and 8 are non-existent or closed and the switch 7 is in open circuit or there is no bypass circuit 14.

Insertion of a circuit made up of at least two illegal connections, namely a connection 20 upstream of the meter 1 and a connection 21 downstream of the meter 1 or a diversion 22, will be called "bypass with diversion". In this case, the meter 1 and the diversion 22 will supply loads in various proportions of their relative input of current. The general example illustrated in FIG. 1 forms a bypass with diversion when the switches 5, 6, 7 and 8 are non-existent or closed with the connections 20, 21 and 22 supplying both loads 4 and 13. The circuit resistances $A_i$ 10, $B_i$ 11, $C_i$ 12 and the resistances of the loads $L_i$ 4 and $S_i$ 13 determine the measured current over the stolen current ratio for each of the loads $L_i$ 4 and $S_i$ 13. It should be noted that electricity theft by disconnection of the neutral is inoperative for a two-phase network (2×125 Vac) as deployed in North America.

In the context of this disclosure, the following terms are used in relation to the meter consumption measurements. $v_{i,m}$ and $c_{i,m}$ are respectively averages of voltage (Volts) and of current (Amperes) observed at a meter "i" during an integration interval of a measurement "m". For simplifying the text that follows, the terms voltage and current will mean, depending on the context, an average of voltage and an average of current during a time interval, in particular an integration interval of a consumption measurement carried out by a meter. I meters are connected to a same transformer. The set of voltage and current measurements on these I meters in a time interval to which a given timestamp is associated will be called a sample $m \in \{1,M\}$. According to a preferred embodiment, the current $c_{i,m}$ of meter i is calculated from the measurements of voltage $v_{i,m}$, of energy $E_{i,m}$ consumed in kW-h and a power factor $\lambda_{i,m}$ such as $$C_{i,m} = \frac{p_{i,m}}{v_{i,m}} \cdot \frac{1}{\lambda_{i,m}}, \tag{1a}$$

where $$p_{i,m} = E_{i,m} \cdot \frac{3600\ s}{\Delta t} \cdot \frac{1000\ \text{W-h}}{1\ \text{kW-h}} \tag{1b}$$

is the active power and $\Delta t$ is the integration interval expressed in seconds. Usually, when the power factor value is unavailable, this value is set to 1.0 by default. Setting this value to another value amounts to modifying the estimates made for the different meters in a same proportion. The ratio of the differences between the meters over the quantity subjected to the difference will remain unchanged, at first order, if the power factor is set to another value. When the power factor instantaneous value is unavailable, the power factor time-variations will be similar to the presence of noise added to the estimate of current (eq. 1a).

When available, a value $V_m$ representative of the instantaneous voltage on the transformer primary may be used to normalize the voltage prior to calculation of the current such as $$\frac{\sum_{m=1}^{M} V_m}{M \cdot V_m} \tag{1c}$$

replaces the instantaneous voltage $v_{i,m}$ of the meters. The representative value may be a transformer secondary voltage measurement, may be calculated from a voltage measurement on the medium-voltage line (at the transformer primary) or calculated from different measurements available on the line. The value $V_m$ is validated before being used. The normalization allows reducing the statistical artifacts explained hereinafter.

In the following, the inaccuracy of the measurement of a meter current sensor is neglected and the goal is to correct inaccuracies of the voltage measurement. The inaccuracy of a meter voltage measurement is mainly the result of the sum of three quantities, namely:

1. the systematic deviation imputed to the electronic components and software for producing the voltage measurement,
2. the slow drift associated to the effect of temperature on the components,
3. the even slower drift associated with the aging of the components.

A meter measurement system may be formed of an analog electronics connected to an analog-to-digital converter usually of the sigma-delta type. Analog conditionings are usually achieved by switch-mode amplifiers which by their design offer a high degree of stability and accuracy. The converter calculates a ratio between an input voltage and a reference voltage for transmitting a digital value of the ratio upstream of the measurement process. The systematic error imputable to the voltage measurement system will thus mainly be formed of a multiplicative coefficient error imputable to the inaccuracy of the reference voltage.

$$V_{i,m} = (1+\alpha_i) \cdot v_{i,m} \tag{2}$$

is the real voltage value as a function of the measured voltage $v_{i,m}$ where $\alpha_i$ is a correction coefficient such as normally $|\alpha_i| \leq 0.002$ for a Class 2 (0.2%).

Figure 2:
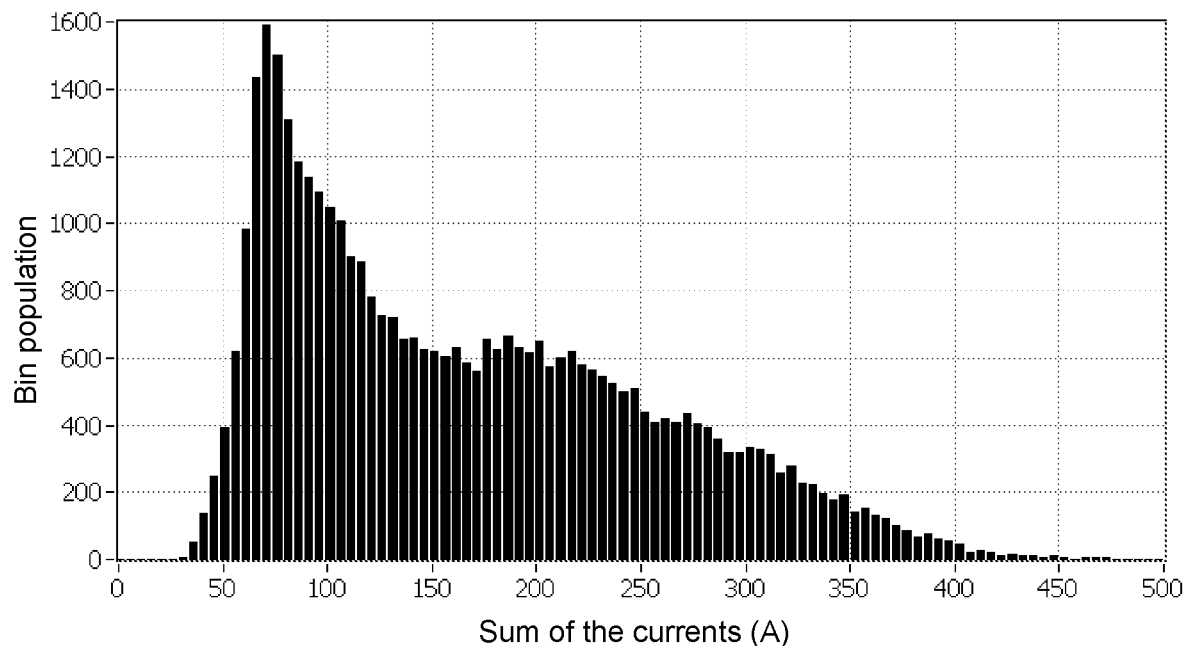
FIG. 2 illustrates an example of distribution histogram of a sum of currents for 39106 samples taken at an interval of 15 minutes for a network comprising 12 meters.
Figure 3:
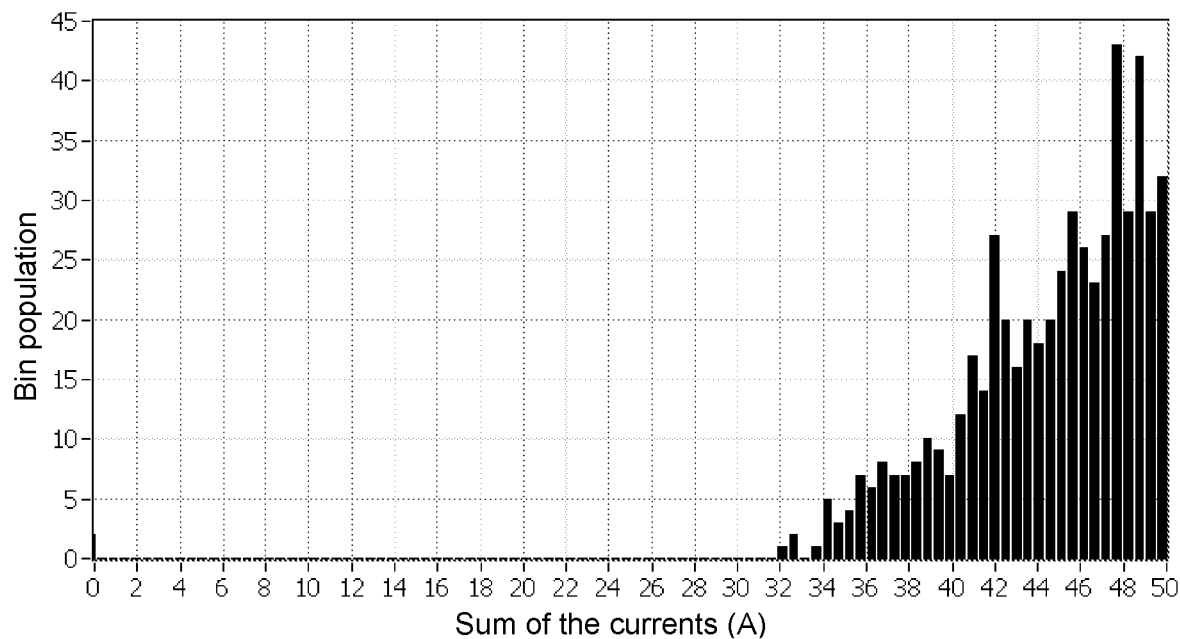
FIG. 3 illustrates a reproduction of the histogram presented in FIG. 2 for a smaller voltage scale with narrower classes, where a 43 A threshold corresponds to just over 1% of the total number of samples.

The measurement of a meter voltage corresponds to the voltage of the medium-voltage line over the transformation ratio of the transformer minus the voltage drop caused by the load currents flowing on the low-voltage network. Since the voltage drops generated by the load currents are not evenly distributed between the meters, the voltage across the meter terminals is uneven from one meter to another. Ideally, in complete load absence, all the meters would have the same voltage at their terminals. A preferred embodiment of the method consists in searching a small fraction of the samples where the lowest total load $\Sigma_i c_{i,m}$ of the group of available samples is observed. In a preferred embodiment, this fraction may be a percentage, typically 1%, or a number, for example a hundred samples, or the first of these thresholds reached. In a preferred embodiment, the number of samples whose total load does not exceed a given threshold is counted and the threshold is iteratively increased until the fraction of desired samples is reached or exceeded. For the example given in FIGS. 2 and 3, 109 samples are retained for a 43 A maximum.

The estimate of $\alpha_i$ is all the more precise as the number of contributing samples is high and the total load is small. Optimally, a selection of a number of contributing samples may be achieved by analysis of a distribution histogram of the total loads observed. Zero or insufficient load samples (predetermined validation criteria) are preferably excluded in the calculation because they have a high probability of corresponding to invalid measurements. A value of minimal total load $C_{min}$ is set such as $$\Sigma_i c_{i,m} \geq C_{min} \tag{3}$$

determines the samples m that are elements of the retained group. Typically, a 60 W minimum may be allowed per meter (for 240 V), which gives $$C_{min}=0.25 \cdot I, \quad (4)$$

thus the product of 0.25 A by the number of meters. However, to establish a group from a derivative of current, $C_{min}=0$ A is set. Likewise, an initial value for the maximal threshold of current $C_{max}$ is set, typically $$C_{max}=2.0 \cdot I, \quad (5)$$

thus the product of 2 A by the number of meters (500 W per client). Finally, a value of $C_{step}$ defining a discrete increase parameter of $C_{max}$ in the iterative loop is set. The smaller $C_{Step}$, the more precisely the iteration will find the value of $C_{max}$ which gives the desired number of samples and more calculation time will be required. A value of 2 A may be used by default for $C_{Step}$. A preferred embodiment of the method uses a state vector state(m) such as $$\text{state}(m) = \begin{cases} 1 & \text{if } C_{min} \le \sum_i c_{i,m} < C_{max} \\ 0 & \text{otherwise} \end{cases} \quad (6)$$

to indicate whether or not a sample is retained such as the values $C_{min}$ and $C_{max}$ are the extrema of the load range of the group.

Figure 4:
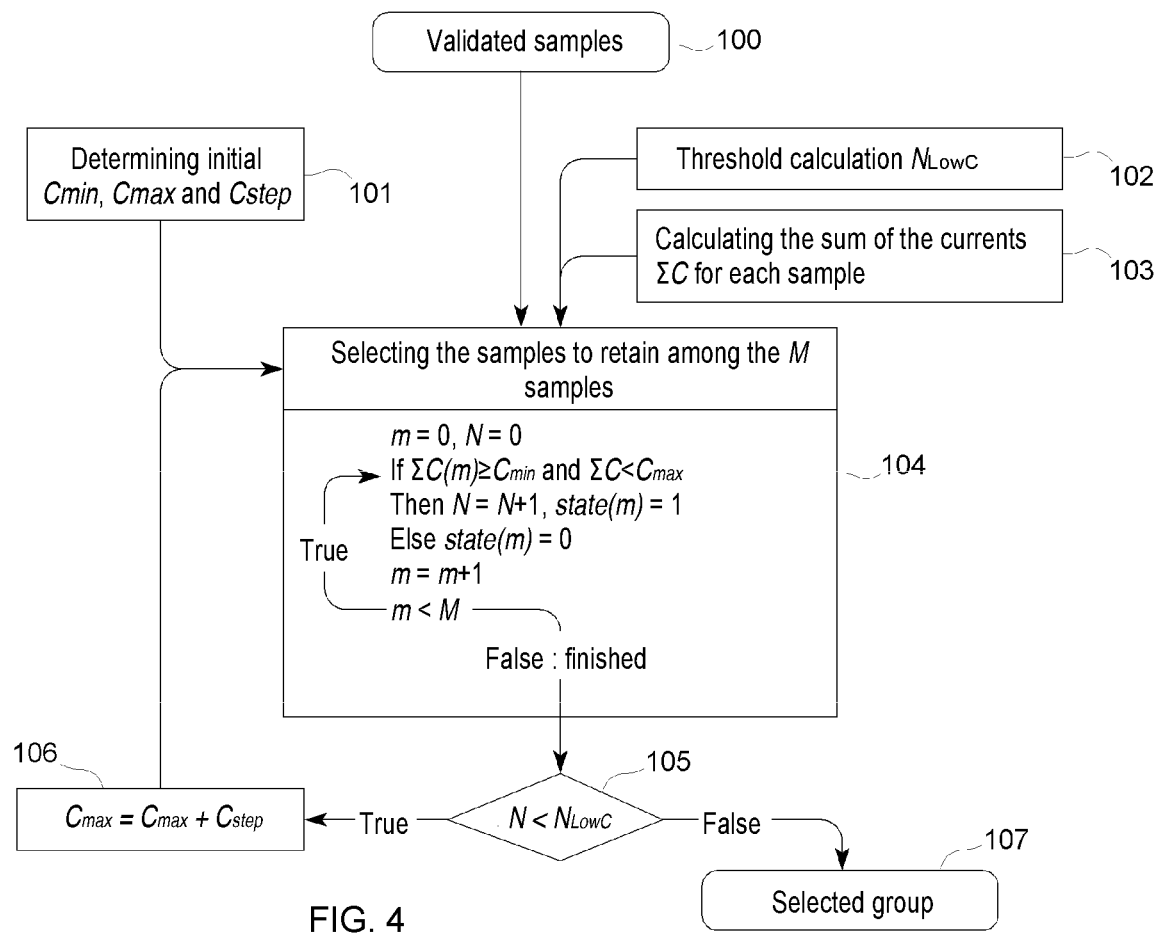
FIG. 4 illustrates a flowchart describing a selection process of samples corresponding to times when the network carries a minimal total current.

Referring to FIG. 4, to select a group of retained samples as depicted by block 107 from validated samples as depicted by block 100, a preferred technique consists in:
1. establishing the threshold $C_{min}$, the initial value of the threshold $C_{max}$ and the step $C_{Step}$ as depicted by block 101,
2. calculating the threshold $N_{LowC}=0.01 \cdot P_{\%\ LowC} \cdot M$ as depicted by block 102, expressed in number of required samples from the desired percentage of samples $P_{\%\ LowC}$ and the total number of available samples,
3. calculating the sum of the currents of the meters for each sample as depicted by block 103,
4. identifying the samples for which $C_{min} \le \Sigma_i c_{i,m} < C_{max}$, updating the state vector state(m) according to equation 6 and increasing the population N of the group of retained samples as depicted by block 104, and
5. if the number of identified samples is less than the threshold $N_{LowC}$ as depicted by block 105, then the value of $C_{max}$ increases by the value $C_{Step}$ as depicted by block 106 and step 4 as depicted by block 104 is repeated, while if the number of cumulated samples reaches or exceeds the threshold $N_{LowC}$, then the selection process is finished and the selected group as depicted by block 107 is available as a result.

From the obtained selection, the average voltage per meter is calculated $$\overline{v}_i = \frac{1}{m_s} \cdot \sum_{m=1}^{M} v_{i,m} \cdot \text{state}(m) \quad (7a)$$

for the I meters and for the time interval defined by the M samples, with $$m_s = \sum_{m=1}^{M} \text{state}(m) \quad (7b)$$

for the population of samples selected among the M samples.

The result may be transmitted for display or other processing for example to detect anomalies. The average voltage of a meter may be compared with that of the other meters or yet with $$\overline{v} = \frac{1}{I}\sum_{i=1}^{I} \overline{v}_i \quad (8)$$

the average voltage of the meters such as $\overline{v}_i - \overline{v}$ is defined as the average voltage deviation of a meter.

The standard deviation characterizing the dispersion of the instantaneous voltage on each meter for the selected group is calculated $$\sigma_i = \qquad (9)$$
$$\sqrt{\frac{1}{m_s-1}\left(\sum_{m=1}^{M}(v_{i,m}-\overline{v}_m)^2 \cdot \text{state}(m) - \frac{1}{m_s}\left(\sum_{m=1}^{M}(v_{i,m}-\overline{v}_m) \cdot \text{state}(m)\right)^2\right)}$$

with regard to the instantaneous average voltage $$\overline{v}_m = \frac{1}{I}\sum_{i=1}^{I} v_{i,m} \quad (10)$$

observed on all the meters for a given sample m. This standard deviation value is produced for display or other processing in order to determine anomalies. The systematic deviation of voltage that a meter measurement may have with respect to the average voltage is eliminated in the calculation proposed at equation 9, as shown in Annex 1 hereinafter.

According to a first order calculation, there is proposed to estimate the systematic voltage error of each meter, to correct the voltages accordingly and to redo certain calculations. According to a preferred embodiment, $$\alpha_i = \sum_m (\overline{v}_m - v_{i,m}) \cdot \text{state}(m) \bigg/ \sum_m v_{i,m} \cdot \text{state}(m) \quad (11)$$

is the voltage correction coefficient to be used in equation 2. The voltage values are first validated so as to exclude, according to a validation criterion, those that correspond to transient periods where, for example, a voltage drop in the measurement period (e.g. 15 minutes) of a sample is observed. The expression $$\alpha_i = \frac{1}{m_s} \cdot \sum_m \frac{1}{v_{i,m}} \cdot (\overline{v}_m - v_{i,m}) \cdot \text{state}(m) \quad (12)$$

is likely to be less precise and robust. For example, if the voltage is disturbed by a transient anomaly on the network (e.g. a short blackout), below the rejection threshold of the voltage data, the division by a smaller voltage will amplify the deviations appearing for the samples corresponding to a transient anomaly, which is not desirable.

According to a second order calculation, there is proposed to correct the voltage drop that each meter has with the average voltage $\bar{v}_m$ as a function of its current. When equation 7a is calculated with the voltages of the meters, all the meter voltages are affected by the current of a single meter. At the second order of approximation, the voltage of the meter may be corrected as a function of its current output by neglecting the voltage drops affecting the other meters that are generated by this current. The voltage drop of each meter caused by the current output by the same meter should thus be corrected for the selected group as depicted by block 107. Three choices of resistance are usable to compensate the voltage drop of the current output by the meter i, namely the low-voltage network resistance, the meter-to-network connection resistance, and the total resistance.

The low-voltage network resistance seen by the meter i may be estimated such as $$Z_i = -\frac{\sum_{m=2}^{M} \partial \widehat{v}_{i,m} \cdot \partial c_{i,m}}{\sum_{m=2}^{M} (\partial c_{i,m})^2}, \quad (13)$$

with the discrete derivative of the instantaneous average voltage $$\partial \widehat{v}_{i,m} = \widehat{v}_{i,m} - \widehat{v}_{i,m-1}, m > 1 \quad (14a)$$

and the discrete derivative of current $$\partial c_{i,m} = c_{i,m} - c_{i,m-1}, m > 1, \quad (14b)$$

and where the instantaneous average voltage $$\widehat{v}_{i,m} = \begin{cases} \sum_{j=1, j\neq i}^{I} v_{j,m} & I > 1 \\ 0 & I = 1 \end{cases} \quad (14c)$$

is such that the network resistance is estimated from the voltage drops observed by the other meters, excluding the targeted meter. The expression given at equation 13 gives a result biased by the correlations between the currents, bias which is called "statistical outliers" in the context of this disclosure. This outlier may dominate the result when there are loads on timers as found for city lighting or for a common space in a commercial or residential building. Indeed, a load on timer generates consumption pulses (square waves) that, once derived according to equations 14a and 14b, gives periodic peaks correlated with the daily load average variation on the network. On one hand, the samples and not their derivatives should be used, and on the other hand, all the consumptions (currents) should be considered in a same calculation in order to have a result unbiased by the correlations between consumptions. One implemented solution consists in adjusting the values $Z_i$ in order to minimize the quadratic deviation residue $$\text{residue} = \sum_{m=1}^{M}\left(\bar{v}_m + \sum_{i=1}^{I} Z_i \cdot c_{i,m}\right)^2 - \frac{1}{M}\left(\sum_{m=1}^{M}\left(\bar{v}_m + \sum_{i=1}^{I} Z_i \cdot c_{i,m}\right)\right)^2 \quad (15)$$

where the quantity $$\bar{v}_m + \sum_{i=1}^{I} Z_i \cdot c_{i,m}$$

corresponds to the instantaneous average voltage corrected by the current flows. The simulated annealing may be a solution to solve expression 15. Normally, the network resistance values should be regrouped close to the small value of the transformer primary resistance. When only one significant deviation is detected for the network resistance of a meter, expression 15 is then minimized by adjusting the network resistance for this meter only, the other values being set by expression 13. The voltage normalization proposed by equation 1c is recommended in the implementation of the residue minimization solution. A refinement of the technique consists in applying a band-pass digital filter on the electrical quantities so as to eliminate the slow time variations corresponding to the daily ones and those of the consumption reaction to temperature.

The network resistance is characteristic of the position of a meter connection on the network. The farther a meter is connected and the more other meters are connected between it and the transformer on the line sharing the same low-voltage cable, the higher its resistance will be with respect to the others.

$$y_{i,m} = v_{i,m} Z_i \cdot c_{i,m} \quad (16)$$

is the meter reading voltage corrected to take into account the voltage drop on the average voltage of the low-voltage network caused by its current. The resistance $Z_i$ is understood here as being the reaction of the average voltage to a load variation of the meter "i".

The meter connection resistance $$r_i = -\frac{\sum_{m=2}^{M}(\partial v_{i,m} - \partial \widehat{v}_{i,m}) \cdot \partial c_{i,m}}{\sum_{m=2}^{M}(\partial c_{i,m})^2} \quad (17a)$$

with the instantaneous voltage discrete derivative $$\partial v_{i,m} = v_{i,m} - v_{i,m-1}, m > 1 \quad (17b)$$

is a representative factor of the connection resistance of the meter "i" through which the current output by the meter i flows, estimated from all the valid and available voltage measurements on the meters, in which case the voltage-series at the meter i may be expressed as $$y_{i,m} = v_{i,m} + r_i c_{i,m} \quad (18a)$$

Adjusting the value $r_i$ in order to minimize the quadratic deviation residue $$\text{residue} = \sum_{m=1}^{M}\left(v_{i,m} + r_i \cdot c_{i,m} - \left(\bar{v}_m + \sum_{i=1}^{I} Z_i \cdot c_{i,m}\right)\right)^2 - \frac{1}{M}\left(\sum_{m=1}^{M}\left(v_{i,m} + r_i \cdot c_{i,m} - \left(\bar{v}_m + \sum_{i=1}^{I} Z_i \cdot c_{i,m}\right)\right)\right)^2 \quad (18b)$$

requires more calculation power but allows reducing the statistical outliers. Contrary to expression 15, the adjustment is achieved on a single value and not for all the values of the meters simultaneously, which requires less calculation power.

The resistance $$R_i = -\frac{\sum_{m=2}^{M} \partial v_{i,m} \cdot \partial c_{i,m}}{\sum_{m=2}^{M} (\partial c_{i,m})^2} r_i + Z_i \quad (19)$$

is a representative factor of the total resistance of the meter "i" estimated from all the valid and available measurements, through which the current output by the meter i flows, in which case the corrected voltage-series at the meter i may be expressed as $$y_{i,m} = v_{i,m} + R_i \cdot c_{i,m} \quad (20a)$$

Here again, to reduce the contribution of a statistical outlier, the value $R_i$ may be adjusted to minimize the quadratic deviation residue $$\text{residue} = \sum_{m=1}^{M} (v_{i,m} + R_i \cdot c_{i,m})^2 - \frac{1}{M}\left(\sum_{m=1}^{M}(v_{i,m} + R_i \cdot c_{i,m})\right)^2 \quad (20b)$$

in which case, if the residue minimization has also been used for the estimate of the connection resistance, $$Z_i = R_i - r_i \quad (20c)$$

is then used in order to calculate, or recalculate in an iterative process, the network resistance without using equation 13 based on the derivatives or equation 15 which may be power calculation exhausting.

The corrected voltage-series may be introduced in equations 7-10 as it will be seen hereinafter. The correction achieved with the network resistance is usually less important than that achieved with the apparent connection resistance since the connection resistance value is usually much higher than the line resistance given the gage ratio of the conductors. However, in the case of a rental building where the meters are connected to a same distribution box, the connection appears as the electrical link between a meter and the distribution box located in the building, thus a few centimeters of conductor: the connection resistance often appears minimal in such case. The correction achieved with the total resistance is often the most important since it is the sum of the other two. It is written "often" because the network resistance sometimes appears negative. For example, when the meter is not connected to the same network as the other meters, the network resistance calculated for the meter is close to zero or even negative. When the network resistance is below a certain threshold (about 8 mΩ for an overhead network), it is indicative of a topology error. When there is only one meter, the network resistance is zero since $\bar{v}_{i,m}=0$ (equation 15) and the apparent connection resistance is equal to the total resistance. A preferred technique for compensating the voltage drop generated by the carried load uses the apparent connection resistance for the purpose of correcting the voltage of a meter with respect to the instantaneous average voltage. The performed correction should not include the effect of the network resistance that is present in the other two resistance values. This correction allows reducing the variations of voltage (equation 7a) or of voltage dispersion (equation 9) generated by the small currents observed for the group of selected samples. However, in some cases, such as a bypass, the correction may have a blinding effect in the detection of an ENC. The resistance value $Z_i$, $r_i$ or $R_i$ is thus limited by two values, namely a minimum value corresponding to a transformer primary resistance (of 2 to 8 mΩ depending on the installation) and a maximum value that is typically set to three times the average of the resistances observed for the other meters connected to the same low-voltage network as the targeted meter. On a two-phase network, for a 200 A or less electrical entrance, connection resistance values over 50 mΩ may correspond to ENCs since they are equivalent to a connection resistance exceeding the 30 m allowed by certain standards (e.g. HQ E.21-10 standard) between the line and the service mast without addition of a support pole, if a 2 AWG gage aluminum conductor (0.68 mΩ/m at 20° C., multiplied by two considering one going and one returning) is considered.

A preferred embodiment for detecting a topology error uses the apparent network resistance. For a meter not connected to the network under process and randomly carrying significant loads, the network resistance is close to zero. City lightings having a cyclic consumption and very low consumption installations will exhibit a value that could be a meaningless statistical artifact no matter whether the meter is on the network under process or not. In such cases, the network resistance may be insufficient to determine if the meter is really connected to the network under process.

The resistance value calculation at equations 13, 17a and 19, may be carried out on a subset of data corresponding to the group where the meter "i" exhibits the relatively most important derivatives of current in relation to the quadratic sum of the derivatives of current of the other meters.

The voltage-series thus corrected by equation 18a may be introduced in equations 7-10 to reduce the bias created by the flowing currents. The estimation of the correction coefficient proposed at equation 11 then becomes $$\alpha_i = \sum_m (\bar{y}_m - y_{i,m}) \cdot \text{state}(m) \bigg/ \sum_m y_{i,m} \cdot \text{state}(m) \quad (21)$$

with $$\bar{y}_m = \frac{1}{I}\sum_{l=1}^{I} y_{l,m} \quad (22a)$$

to take into account the voltage drops with respect to the average voltage observed by all the meters, the preferred embodiment using $y_{1,m}$ defined by expression 18a with the apparent connection resistance $r_i$ for correction of the voltage drop induced by the current measured at the meter. The sum of the $\alpha_i$ is zero for the expressions given at equations 11 and 21.

The estimate of $\alpha_i$ given at equation 11 or 21 inserted in equation 2 allows correcting the systematic voltage deviation error between the voltage of a meter and the group of meters connected to the same low-voltage network. The systematic error common to all the meters of a same network is not corrected and remains unknown for the subsequent processings. The method minimizes the meter voltage measurement static and systematic deviation with respect to the average of the voltages measured by the meters of the same network. These corrected voltages may advantageously be used in algorithms for detection and quantification of ENCs to allow a more precise comparison of the electrical measurements and of the analysis results between meters. In metrology, knowing the relative voltage bias for a given meter manufacturing brand allows directing the certification actions. A correction of the consumption may also be applied knowing that for certain meter types, the measurement of current is subjected to the same bias.

It should be noted that the average portion of an ENC will be "erased" by the relative calibration mechanism proposed at equation 2 and will no longer be visible in the subsequent processings performed to detect an ENC. An excessive value of the correction coefficient $\alpha_i$ is also an indicator of a probable ENC. This indicator being correlated with the average voltage deviation (equation 8), one or the other of these indicators may be chosen to report an ENC. In a preferred embodiment, from the selection obtained with equation 6, the average voltage per meter is calculated while considering the voltage drop in the connection of each meter such as $$\overline{v}_i = \frac{1}{m_s} \cdot \sum_{m=1}^{M} y_{i,m} \cdot \text{state}(m) \quad (22b)$$

is the estimate of the no-load average voltage per meter.

Figure 5:
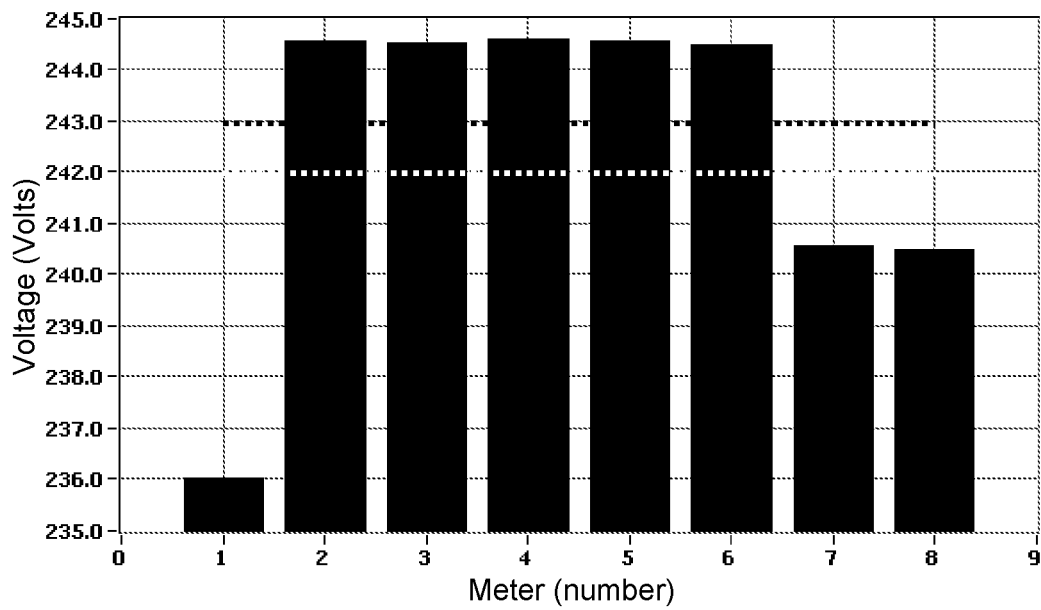
FIG. 5 is a graph illustrating no-load average voltages of 8 meters on a network.
Figure 6:
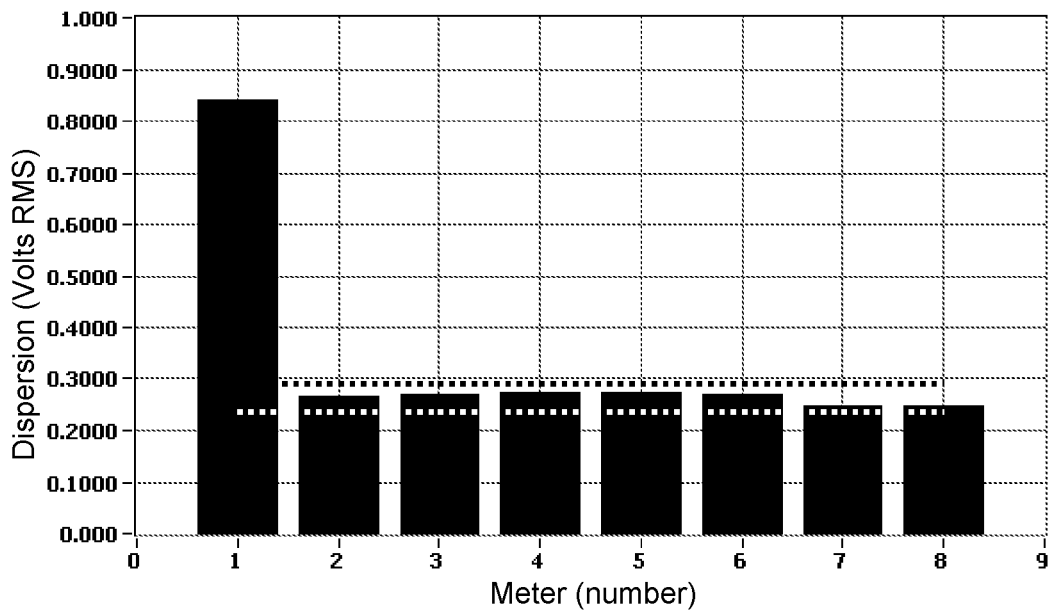
FIG. 6 is a graph illustrating a dispersion of the instantaneous voltage observed on each meter when there is little load carried on the same network as that of FIG. 5.
Figure 7:
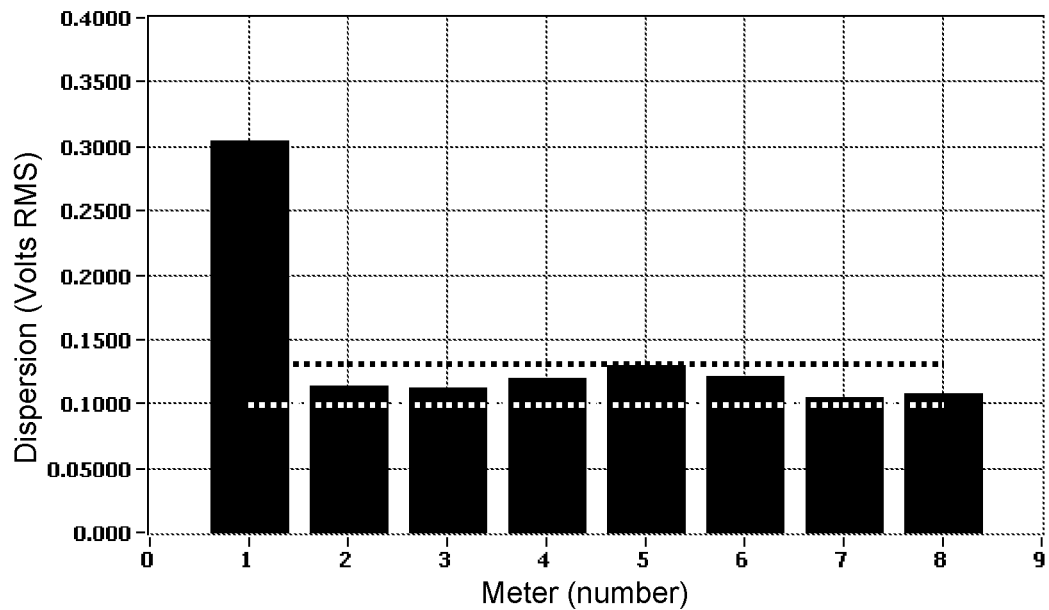
FIG. 7 is a graph illustrating a dispersion of the instantaneous voltage derivative observed on each meter when there is little load carried on the same network as that of FIG. 5.

Referring to FIGS. 5, 6 and 7, there is shown an applicative example of important energy diversion observable in a network. In the example, the network comprises eight meters. FIG. 5 is a graph illustrating a no-load average voltage of each meter, the dotted lines corresponding to ±0.2% of deviation with respect to the average voltage of the group. FIG. 6 is a graph illustrating a dispersion of the instantaneous voltage observed on each meter when there is little load carried on the network, the dotted lines corresponding to ±3 times the standard deviation of the dispersions calculated from the group of non-aberrant samples (i.e. meter #1 is excluded from the calculation). FIG. 7 is a graph illustrating a dispersion of the derivative of instantaneous voltage observed on each meter when there is little load carried on the network, the dotted lines corresponding to ±3 times the standard deviation of the dispersions calculated from the group of non-aberrant samples (i.e. meter #1 is excluded from the calculation). Among the eight meters of this network, meter #1 has a significantly lower voltage, well below 0.2% of the average of the no-load average voltages of all the meters, has a dispersion of the instantaneous voltage more than the double of the other dispersion values, and has a dispersion of the instantaneous voltage derivative more than the double of the other dispersion values. In reference to the minimum and maximum thresholds, meter #1 exhibits a clear excess for the voltage, the voltage dispersion and the dispersion of the voltage derivative. In FIG. 5, an important voltage drop may be observed for meters #7 and #8 which is explained by the fact that these meters share a longer portion of the medium-voltage cable with meter #1 up to the transformer.

Figure 8:
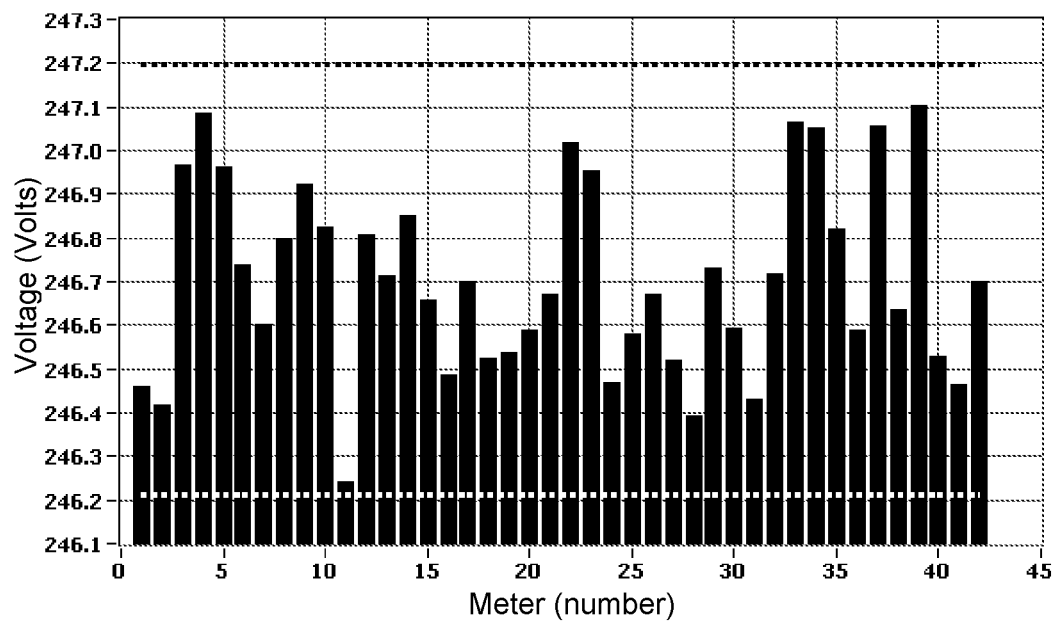
FIG. 8 is a graph illustrating average voltages of 42 meters when there is little load carried on a network.
Figure 9:
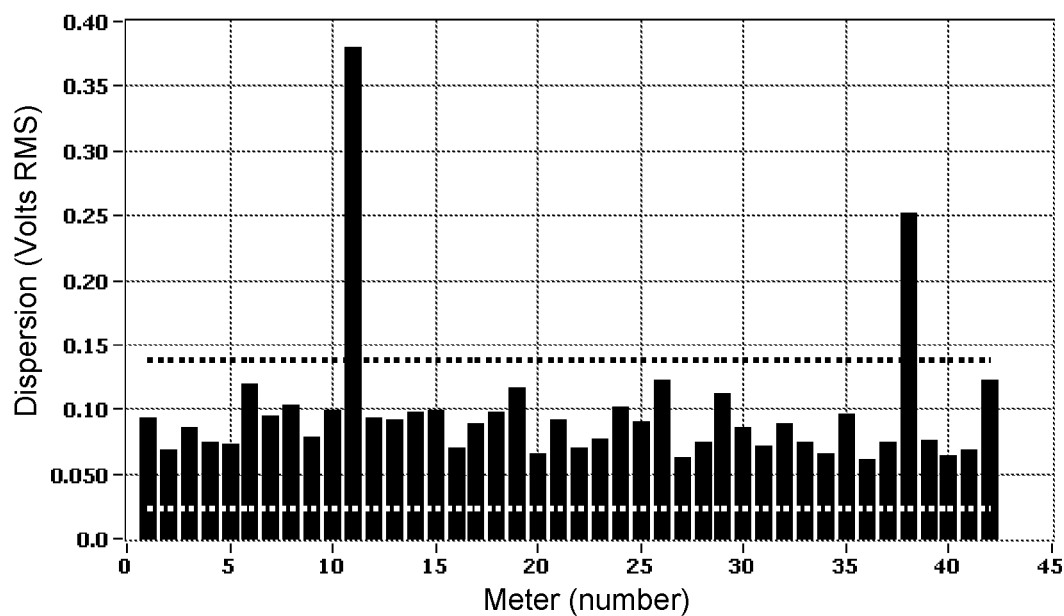
FIG. 9 is a graph illustrating a dispersion of the instantaneous voltage observed on each meter when there is little load carried on the same network as that of FIG. 8

Referring to FIGS. 8, 9, 10, 11 and 12, there is shown another applicative example observable in a network. In the example, the network is an underground network comprising 42 meters connected to a same transformer. Several anomalies are observed on three meters of the underground network. FIGS. 8 and 9 respectively show the no-load average voltage and the dispersion of the instantaneous voltage of each meter when there is little load carried on the network. In FIGS. 8 and 9, there are shown dotted lines depicting thresholds between which the normal values are supposed to lie. For FIG. 8, these thresholds correspond to the voltage measurement precision deviation, thus at ±0.2% for a class 2 meter from the average voltage of the group. For FIG. 9, the thresholds correspond to ±3 times the standard deviation of the dispersions calculated from the group of non-aberrant samples, thus those that lay inside the ±3 sigma of a first dispersion calculation (i.e. meters #11 and #38 are excluded from the calculation).

Three anomalies are detected from the voltage and the dispersion on the voltage respectively illustrated in FIGS. 8 and 9, namely:

meter #11 has a voltage close to the lower threshold limit laying at −0.2% of the no-load average voltage, and an abnormal dispersion of its voltage, meter #38 exhibits an abnormal dispersion.

These anomalies point towards a possible ENC (connection problem, hot spot, missing meter, extra meter not connected, electricity theft or other), and among others, meter #11 has since been replaced and meter #38 had an electromechanical meter by its side. A constant bypass, thus in absence of manipulations of the switches 5, 6 and 7 (as shown in FIG. 1), is not easily detected because it generates a minimal voltage drop and a negligible increase of the instantaneous voltage dispersion. However, for a bypass with manipulations, if these manipulations occur in the retained group, they are likely to increase the dispersion of the instantaneous voltage of the bypassed meter. A diversion will have a good chance of being detected because the current flowing through it is not considered in the choice of the group of the selected samples. The average voltage will be lower for the meter or meters sharing the same connection than the diversion and the dispersion will be more important for these meters. The presence of an electromechanical meter by the side of a smart meter will have the same impact as a diversion. A dispersion anomaly may also arise from the simple fact that the meter exhibiting the anomaly is one of the meters that carries the most current in the group and this in a discontinuous manner. A comparison between the instantaneous voltage dispersion and with the average RMS current of the meter allows discarding these anomalies. A possible correction is proposed hereinafter to take into account the flowing currents in the calculation of the voltage dispersion.

Figure 10:
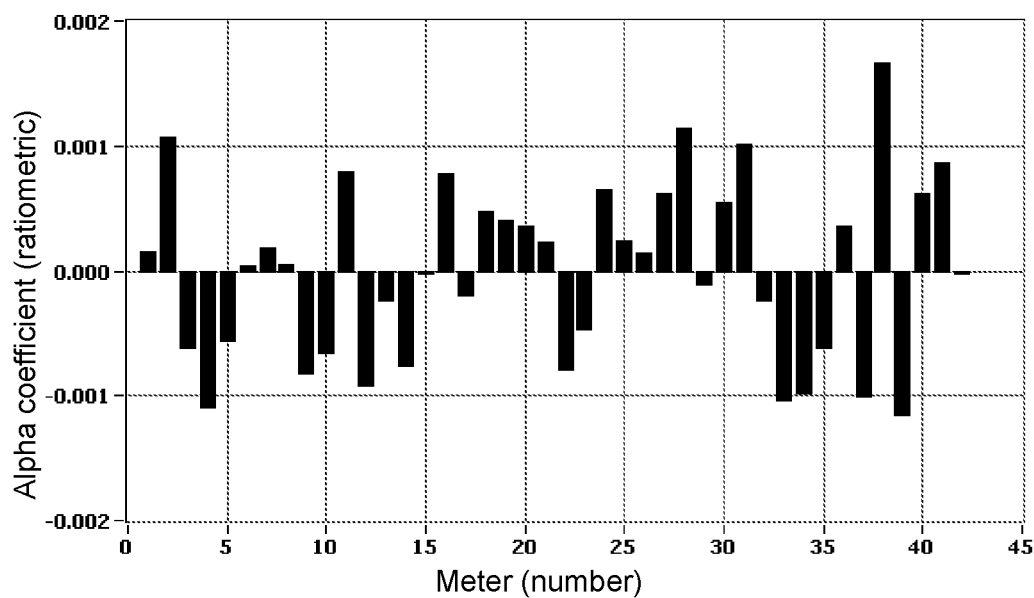
FIG. 10 is a graph illustrating a voltage correction parameter value for each meter estimated from the measurements when there is little load carried on the same network as that of FIG. 8.
Figure 11:
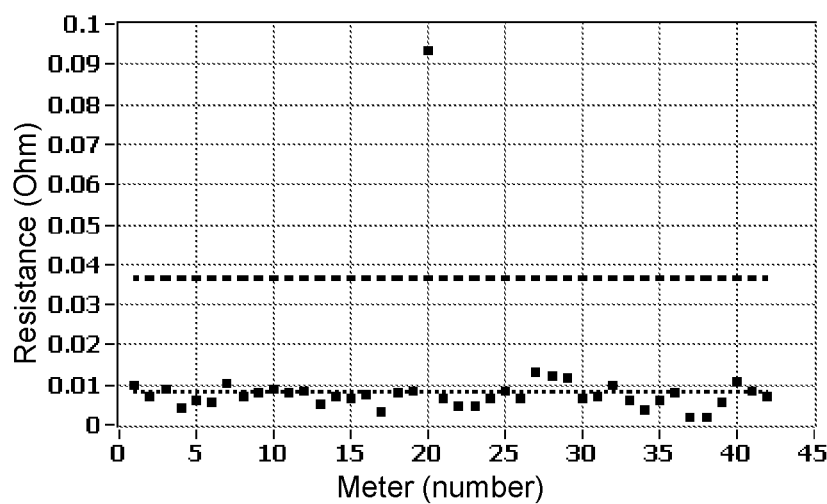
FIG. 11 is a graph illustrating an apparent network resistance $Z_i$ of each meter with regard to an average voltage drop observed on the same network as that of FIG. 8, caused by a load switched by the meter.

FIG. 10 illustrates correction values $\alpha_i$ calculated from the same data as those illustrated in FIGS. 8 and 9, the vertical scale limits of the graph corresponding to the specification of ±0.2% of deviation on the voltage measurement. An important deviation of the value of the correction coefficient $\alpha_i$ for a meter may denote an anomaly, most often a topological problem where the meter is not connected to the proper transformer. In practice of a country having a cold season, for meters providing from a same manufacture batch, a stratification of the values $\alpha_i$ regrouped into three batches respectively corresponding to the meters located outside, to the meters located in mostly unheated garages and to the meters located in heated rooms may be observed in winter. In FIG. 10, there appears no significant deviation. However, the calculation of the apparent network resistance illustrated in FIG. 11 locates meter #20 far from the other apparent resistance values. In this last example, meter #20 supplies the common area of a rental building comprising 8 units where the 9 meters are connected to the busbar of a distribution box located in the building. In the hypothesis of a bypass, the meter performing the bypass reads the same voltage as the other meters so that here, it is the network resistance that increases while the connection resistance remains similar to the other meters.

Figure 12:
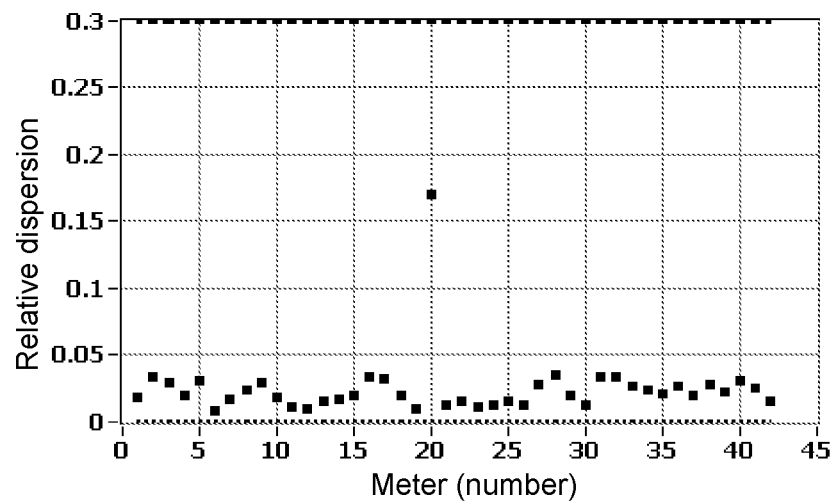
FIG. 12 is a graph illustrating a relative dispersion $ETYZr_i$ of the apparent connection resistance $r_i$ of each meter of the same network as that of FIG. 8.
Figure 13:
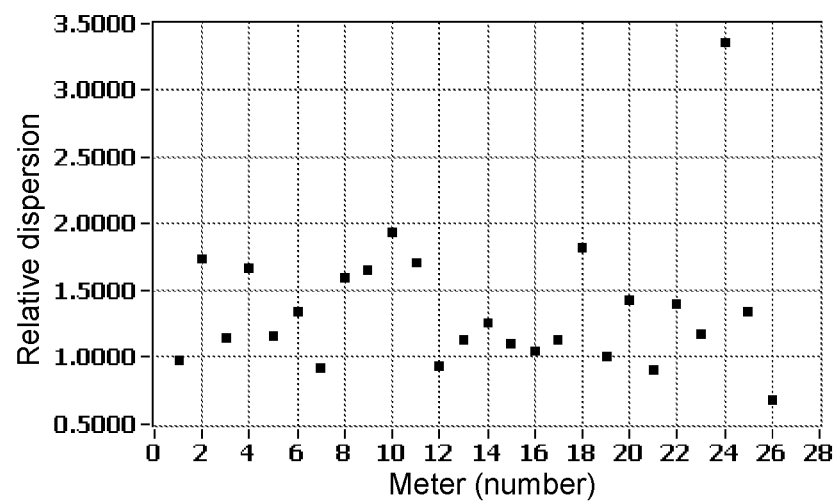
FIG. 13 is a graph illustrating an example of relative dispersion $ETYZRi$ of network resistances of meters for a case of electricity theft by alternate diversion.

Regarding the dispersion of the resistances $Z_i$, $r_i$ and $R_i$, the expressions $$ETYZ_i = \frac{1}{\sum_m \partial c_{i,m}^2} \cdot \sqrt{\frac{1}{M-2} \cdot \left(\sum_{m=2}^{M} \left(\partial \hat{v}_{i,m} \cdot \partial c_{i,m}\right)^2 - \frac{1}{M-1}\left(\sum_{m=2}^{M}\left(\partial \hat{v}_{i,m} \cdot \partial c_{i,m}\right)\right)^2\right)}, \quad (23a)$$

$$ETYr_i = \frac{1}{\sum_m \partial c_{i,m}^2} \cdot \quad (23b)$$
$$\sqrt{\frac{1}{M-2} \cdot \left(\sum_{m=2}^{M} \left((\partial v_{i,m} - \partial \hat{v}_{i,m}) \cdot \partial c_{i,m}\right)^2 - \frac{1}{M-1}\left(\sum_{m=2}^{M}\left((\partial v_{i,m} - \partial \hat{v}_{i,m}) \cdot \partial c_{i,m}\right)\right)^2\right)}$$

$$ETYR_i = \frac{1}{\sum_m \partial c_{i,m}^2} \cdot \sqrt{\frac{1}{M-2} \cdot \left(\sum_{m=2}^{M} \left(\partial v_{i,m} \cdot \partial c_{i,m}\right)^2 - \frac{1}{M-1}\left(\sum_{m=2}^{M}\left(\partial v_{i,m} \cdot \partial c_{i,m}\right)\right)^2\right)} \quad (23c)$$

propose estimates using the usual standard deviation calculation. FIG. 12 illustrates, for the example given in FIGS. 8-11, the relative dispersion of the connection resistances $r_i$. In this example, meter #6 is the one that carries the most variation of current on the network and from this fact, the estimate of its network resistance exhibits the lowest dispersion. The high dispersion of the connection resistance of meter #20 may be explained by a statistical outlier or may appear more important than that of the other meters because a bypass decreases in the proportion of its bypass factor the ratio of the current value measured by this meter over the measurement noise. In the case of meter #20, it has been determined that it is a statistical outlier explained by the presence of a timer for the common area lighting along with electronic thermostats. The expression proposed at equation 15 has enabled to correct this outlier. FIG. 13 shows an example where the abnormal dispersion of the meter network resistance is explained by a bypass with alternate diversion. Indeed, referring to FIG. 1, two states are mainly observed, namely with the switches 5-6-7 in close-open-open state or in open-close-close state. The close-close-close intermediate state briefly appears in this example so that the apparent resistance is not significantly increased. However, these manipulations significantly increase the apparent resistance dispersion as illustrated in FIG. 13.

The standard deviation, given at equation 9, characterizing the dispersion of the instantaneous voltage on each meter with respect to the instantaneous average voltage, is amplified by the flowing currents and this even for a group comprising small currents. Equation 9 may be rewritten by replacing the voltage by the corrected voltage (equation 18a) such as $$\sigma_i = \sqrt{\frac{1}{M_s - 1}\left(\sum_{m=1}^{M}(y_{i,m} - \overline{y}_m)^2 \cdot \text{state}(m) - \frac{1}{m_s}\left(\sum_{m=1}^{M}(y_{i,m} - \overline{y}_m) \cdot \text{state}(m)\right)^2\right)} \quad (24a)$$

where $$\overline{y}_m = \frac{1}{I}\sum_{i=1}^{I} y_{i,m}, \quad (24b)$$

so that the contribution of the voltage drops in the connections is minimized. If a meter carries a hidden load, the dispersion of the voltage drop caused by this load variation will then be more apparent.

Likewise, a dispersion of the corrected instantaneous voltage derivative is calculated $$\sigma_i = \quad (25a)$$
$$\sqrt{\frac{1}{M_s - 1}\left(\sum_{m=1}^{M}(\partial y_{i,m} - \overline{\partial y}_m)^2 \cdot \text{state}(m) - \frac{1}{m_s}\left(\sum_{m=1}^{M}(\partial y_{i,m} - \overline{\partial y}_m) \cdot \text{state}(m)\right)^2\right)}$$

where $$\partial y_{i,m} + \partial v_{i,m} + r_i \cdot \partial C_{i,m} \qquad (25b)$$

is the corrected voltage derivative and $$\overline{\partial y}_m = \frac{1}{I} \sum_{i=1}^{I} \partial y_{i,m} \qquad (25c)$$

is the average value of the voltage derivative. Removal of the average value of the derivative is achieved because this average remains significant for a group of a finite number of samples.

Figure 14A:
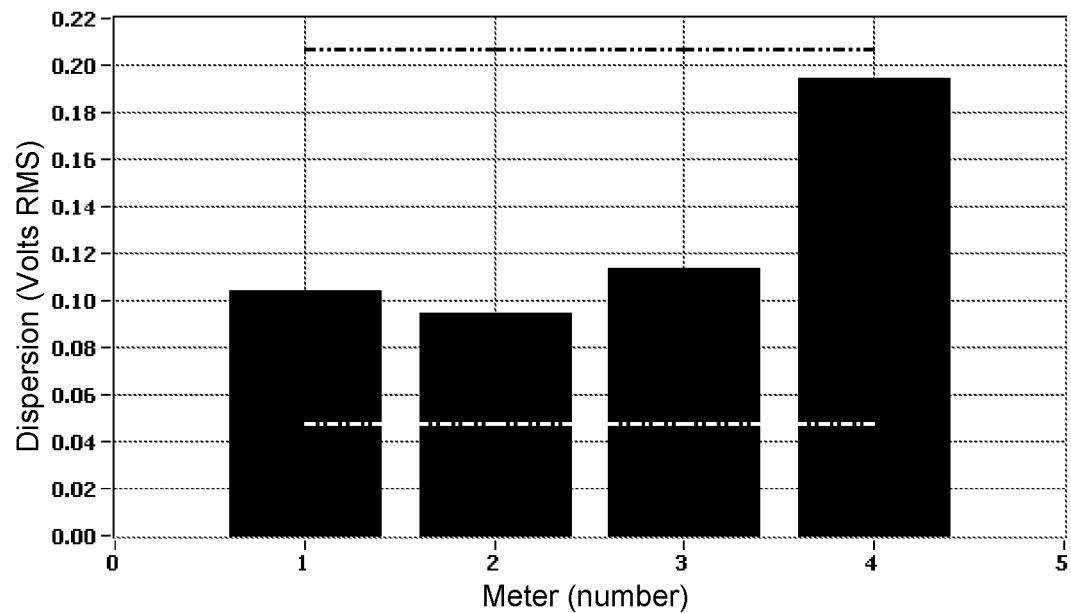
FIGS. 14A and 14B are graphs respectively illustrating a dispersion of the non-corrected voltage derivative for a low-voltage network comprising four meters and the dispersion calculated from the voltage corrected for the voltage drops corresponding to the consumptions measured by the meters, the minimum and maximum thresholds appearing in dotted lines.
Figure 14B:
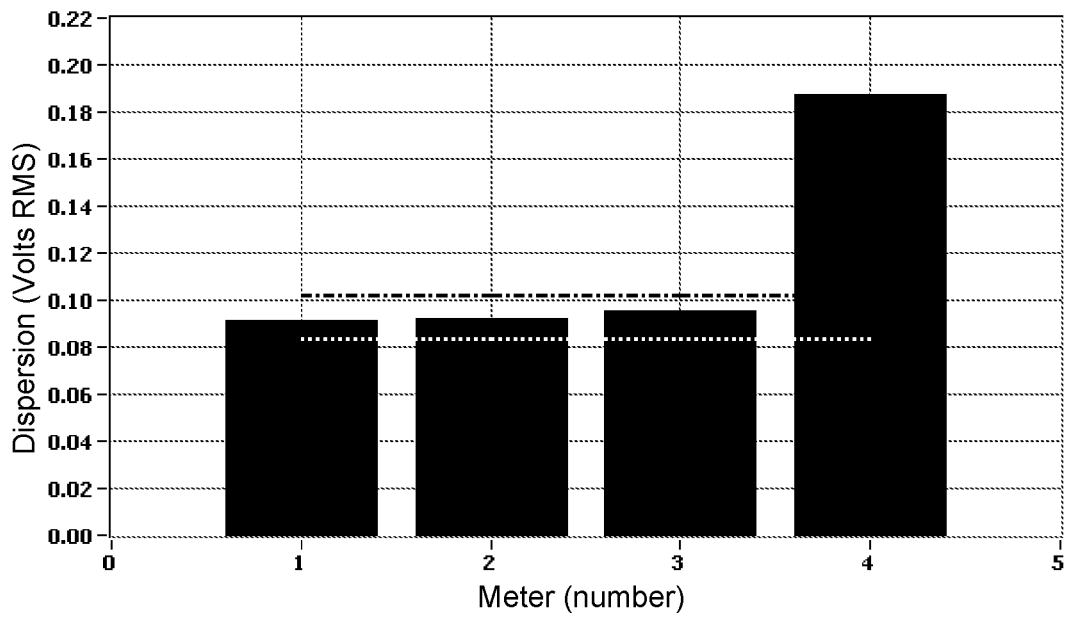

Referring to FIGS. 14A and 14B, there is shown an example of voltage drop correction performed for a low-voltage network comprising four meters. In this example, the first and third meter carry more load variations than the other two. As illustrated in FIG. 14B, the voltage drop correction reduces the dispersion of the first three meters towards a common value while the fourth meter remains with a dispersion much higher than the others. An ENC may be suspected for this fourth meter. In other observable cases, what may appear as exceeding the anomaly threshold returns under the threshold after the voltage drop correction. In this example the anomaly thresholds are determined according to a multiple of the standard deviation of the observed values. However, for FIG. 14B, the value of the fourth meter is considered as an outlier and is excluded from the calculation of these thresholds and this is why the value of the thresholds dramatically changes with the voltage drop correction.

Figure 15A:
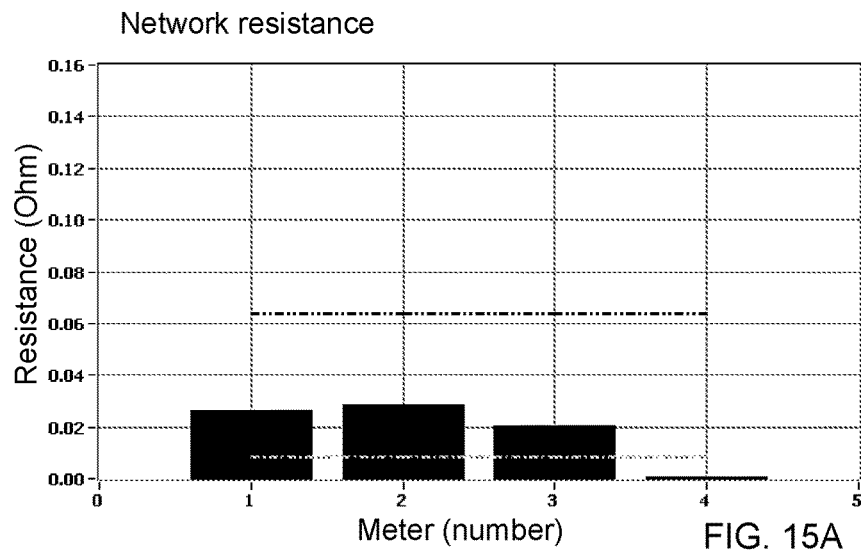
FIGS. 15A, 15B and 15C are graphs respectively illustrating examples of network resistance, connection resistance and total resistance values obtained for the same case as that illustrated in FIGS. 14A and 14B.
Figure 15B:
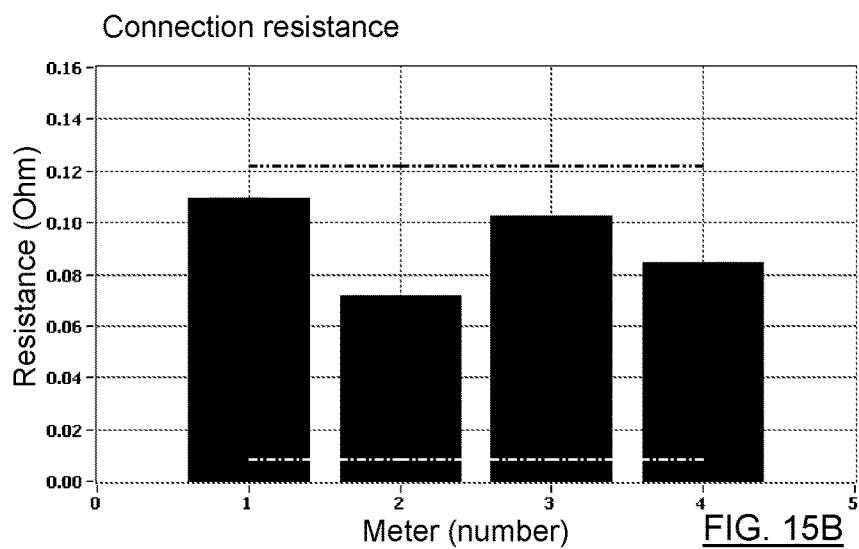
Figure 15C:
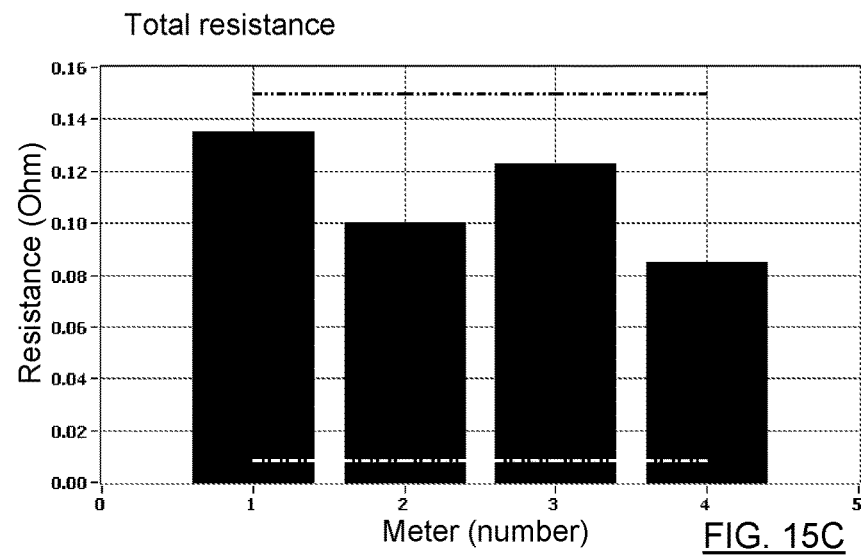

FIGS. 15A, 15B and 15C use the same case as FIGS. 14A and 14B to illustrate the difference between the various types of apparent resistance. Here, for the fourth meter, the total resistance and the connection resistance appear normal while the network resistance is close to zero, much under the 80 mΩ threshold. The other meters do not perceive the load switchings of the fourth meter. The verdict is a meter-transformer pairing error ENC. In other words, the fourth meter is not on this network. This example shows the usefulness of separating the total resistance in two distinct resistive values, namely the network resistance and the connection resistance. If the method involves having a meter-transformer pairing of the low-voltage network beforehand, a topology error is however detectable as when a meter under test is not connected to the other meters participating to the average voltage calculation and gives an aberrant resistive value.

A lighting unit with switchings daily synchronized with consumption peaks may generate a statistical outlier including obtaining a negative apparent resistance. In a preferred embodiment, a particular profile (time pattern) of the city lightings is recognized so that the corresponding meters are processed differently (e.g. minimization of a quadratic residue) and especially excluded from the diagnostic processing of the ENCs.

Referring again to FIG. 1 and to the explanations related to a bypass, if a client activates the bypass switchings according to a constant pattern, this manipulation will generate significant inconsistencies and aberrations of its estimate values of the network resistance, of the connection resistance and of the total resistance. Depending on the chosen pattern, the regularity of its execution and its correlation with the consumption peaks, the relative dispersions ETYZ, ETYr and ETYR calculated for this client may significantly distinguish from the other resistance calculations. An impediment to the use of the resistance dispersion is to distinguish between the meters with a small flow of current and the bypasses. Both will exhibit a small flow of current and an important dispersion. If the bypass switches 5, 6 and 7 are activated on a seasonal basis, it is then possible to observe a large dispersion and even more than one distinct value of apparent resistance depending on the seasonal pattern used (position of the switches and time of activation). Likewise, if these switches are activated according to a daily pattern, it is then possible to observe a daily pattern in the value of the resistance and the dispersion value of this resistance. To determine a daily pattern, it is possible, for example, to bin the available data by time slice, process them and display them in 12 or 24 distinct blocks.

The maximum value of current $$C_m = \max\{c_{1,m}, c_{2,m}, \ldots, c_{i,m}\} \qquad (26)$$

observed on the meters for a sample in may be substituted to the sum of the currents performed at step 104 (shown in FIG. 4) and be substituted to the corresponding result in equation 3 so that $$\text{state}(m) = \begin{cases} 1 & \text{if } C_{min} \le C_m < C_{max} \\ 0 & \text{otherwise} \end{cases} \qquad (27)$$

replaces equation 6. Both variants exhibit similar results and depending on the case of electricity theft, the sum of the currents or the maximum of current may exhibit a better sensitivity according to the case.

In the case of a network comprising energy producers with meters provided for this purpose, it is the absolute values of the discrete values of current that are taken into account in the sum of the currents at equations 3 and 6 and in the argument max{ } of equation 26.

For the detection of electricity theft, an advantageous technique consists in replacing the current $c_{i,m}$ and the voltage $v_{i,m}$ by their respective discrete derivatives. The time-series of the discrete derivatives on the current may be expressed as $$\partial c_{i,m} = c_{i,m} - c_{i,m-1} \qquad (28)$$

and the time-series of the discrete derivatives on the voltage may be expressed as $$\partial v_{i,m} = v_{i,m} - v_{i,m-1} \qquad (29)$$

in which case the sum of the currents in equation 3 is replaced by $$\Sigma_i f(\partial c_{i,m}) \qquad (30)$$

thus the sum of a function of the discrete derivatives on the current or, according to the technique proposed at equation 26, this sum is replaced by $$C_m = \max\{f(\partial c_{1,m}), f(\partial c_{2,m}), \ldots, f(\partial c_{I,m})\}, \qquad (31)$$

thus the maximum of a function of the variation of current observed on the meters for the sample m. Typically, the function $f(\ )$ is the absolute value $$f(\partial c_{i,m}) = |\partial c_{i,m}| \qquad (32a)$$

or the square $$f(\partial c_{i,m}) = (\partial c_{i,m})^2. \qquad (32b)$$

For these two examples of function, the minimum threshold of current $C_{min}$ is set to zero, and the threshold $C_{max}$ and the step $C_{step}$ are adjusted accordingly. The determinations of the averages and the deviations proposed at equations 7a and 9 may be carried out on the voltage or the voltage derivative (equation 29) from the group determined according to one of the previous techniques. Preferably, the voltages are observed as a function of a group minimizing the currents and the voltage variations as a function of a group minimizing the variations of current.

An interesting case of electricity theft consists in alternating a load from the legal consumption to a diversion circuit connected upstream of the meter as detailed in Table 1.

TABLE 1

(in reference to FIG. 1)
Example of switching states operated in certain techniques of electricity theft consisting in displacing a load from the legal consumption to a diversion circuit.

|  | Switch 6 | Switch 7 | Switch 8 |
|---|---|---|---|
| Load $S_i$ 13 in legal consumption | open | close | close |
| Load $S_i$ 13 in diversion | close | open | close |

Two similar loads, one supplied by the meter circuit and the other by the diversion circuit, operated such that either one or the other is supplied, gives the same result as a same load switched from one to the other of the circuits. This manipulation allows decreasing the apparent resistance since for a portion of the load, namely the switched load, there is no voltage variation observed at the meter. Among other things, such a manipulation allows hiding a bypass when a detection method as that proposed in US 2015/0241488 (Sonderegger) is used. Indeed, well performed, this manipulation does not add to the dispersion of the total resistance measurement and adequately lowers the value of this resistance. To detect this manipulation, the times when there has been a small voltage variation in return to a large variation of current flowing through the meter are counted. A problem is that the meter is not alone and that the times when there have been important variations of current only for the meter under test must be searched. For this purpose, a preferred embodiment replaces the current of the sum of meters by another quantity that, for example, may be a ratio between the sum of the discrete derivatives of current of the other meters over the discrete derivative of current of the meter targeted for the detection. In a preferred embodiment, for the detection of this type of manipulation, the state vector is expressed as $$state_i(m) = \begin{cases} 1 & \text{if } D_{min} \leq d_{i,m} < D_{max} \\ 0 & \text{otherwise} \end{cases} \quad (33)$$

to determine the samples retained for the subsequent processings so that the values $C_{min}$ and $C_{max}$ define extrema of the range of load variation ratio of the group. A state vector is calculated (a group is determined) for each meter. In the preferred embodiment, the quantity $$d_{i,m} = \frac{\sum_{j \neq i} g(c_{j,m})}{g(c_{i,m}) + \varepsilon_i}, \, g(c_{j,m}) \equiv \partial c_{j,m}^2 \quad (34)$$

is defined with $$\varepsilon_i = \varepsilon \cdot \frac{1}{M} \cdot \sum_{m=0}^{M-1} g(c_{i,m}) \quad (35)$$

an infinitesimal positive value allowing avoiding divisions by zero and for which $\varepsilon = 10^{-5}$ typically. Using $g(c_{j,m}) \equiv |\partial c_{j,m}|$ instead may give results very close from the preferred embodiment but on average less precise over a large number of cases. The quantity $D_{min}$ is preferably set to zero while the value $D_{max}$ is set to obtain the desired number of retained samples. When the targeted meter is partially bypassed, little current flows through it so the value $D_{max}$ is then set much higher than for the other meters.

The group determined with equation 33 corresponds to the times when the targeted meter switches the most important loads with respect to the loads switched by the other meters. This group is used for the calculation of the resistances and dispersion on the resistance whose results are compared to the same estimates made for another group, for example all the available samples. If the estimates obtained with the group determined with equation 33 give a lower resistance value and an increased dispersion (example of comparison criteria), it means that there is likely an alternation of loads between the targeted meter and a diversion circuit. A preferred embodiment for detecting this type of manipulation is a counting of the values of $-\delta v/\delta c$ appearing below a minimum threshold, and even negative, for a variation of current $\delta c$ set to a minimum value (e.g. 10 or 15 A) in order to eliminate the normal voltage fluctuations and observe only the voltage deviations associated to large switchings of current. In a preferred embodiment, a counting threshold is set to 10 for a group of samples distributed over a year. Among the voltage fluctuations that are perceived as noise, it is worth recalling that a variation of the power factor of an important load creates such a fluctuation. Some meters where an occasional reactive load is operated will exhibit more important voltage fluctuations. It may be advantageous to calculate the voltage derivative and the derivative of current for three time-contiguous samples instead of two because a load switching occurs according to a uniform density in the measurement interval of a sample (e.g. 15 minutes). The difference between the sample after and the sample before the sample where a switching occurs is then considered.

Table 2 below summarizes the links between electrical anomalies and their impact on the indicators determined by the method according to the invention. The mixed/alternate electricity theft refers to the bypass with diversion where manipulations occur during the acquisition period of the samples. A mixed/alternate electricity theft has many symptoms in common with a topology error. A meter sharing a connection with an electromechanical meter will exhibit the same symptoms as a diversion since the load variation of the electromechanical meter will cause a voltage variation proportional to the connection resistance. A connection defect is located between the connection on the low-voltage network and the meter base while a hot spot is a defect located in the base supporting the plug-in meter. These two defects are similar and appear as a connection resistance variation accompanied by a voltage drop so that it is difficult to distinguish between the latter from the electrical measurements alone. In any case, whether it is one or the other defect, an on-site investigation will allow finding the source.

TABLE 2

Link commonly observed between an indicator
determined by the method and an electrical anomaly

| | Electricity thefts | | | Defective | |
| Indicator | Constant bypass | Diversion | Mixed/Alternate | connection Hot spot | Topology error |
|---|---|---|---|---|---|
| Average voltage (eq. 7a) | — to small ↓ | ↓ | A | ↓ | A |
| Instantaneous voltage dispersion (eq. 9) | — | ↑↑ | ↑ | ↑ | ↑↑ |
| $\alpha_i$ (eq. 11) | — to small ↑ | ↑ | ↑ | ↑ | A |
| Network resistance $Z_i$ (eq. 13) | ↑ to ↑↑ | — | A | — | ↓↓↓ ≈ 0 |
| Dispersion of $Z_i$ (eq. 23a) | — | ↑ | ↑ | ↑↑ | ↑ |
| Connection resistance $r_i$ (eq. 17a) | ↑ to ↑↑↑ | — | A | ↑ to ↑↑↑ by occurrences | A |
| Dispersion of $r_i$ (eq. 23b) | — | ↑ | ↑ | ↑↑ | ↑ |
| Count of overruns δv/δc | — | — | ↑↑↑ | — | — |

Figure 16:
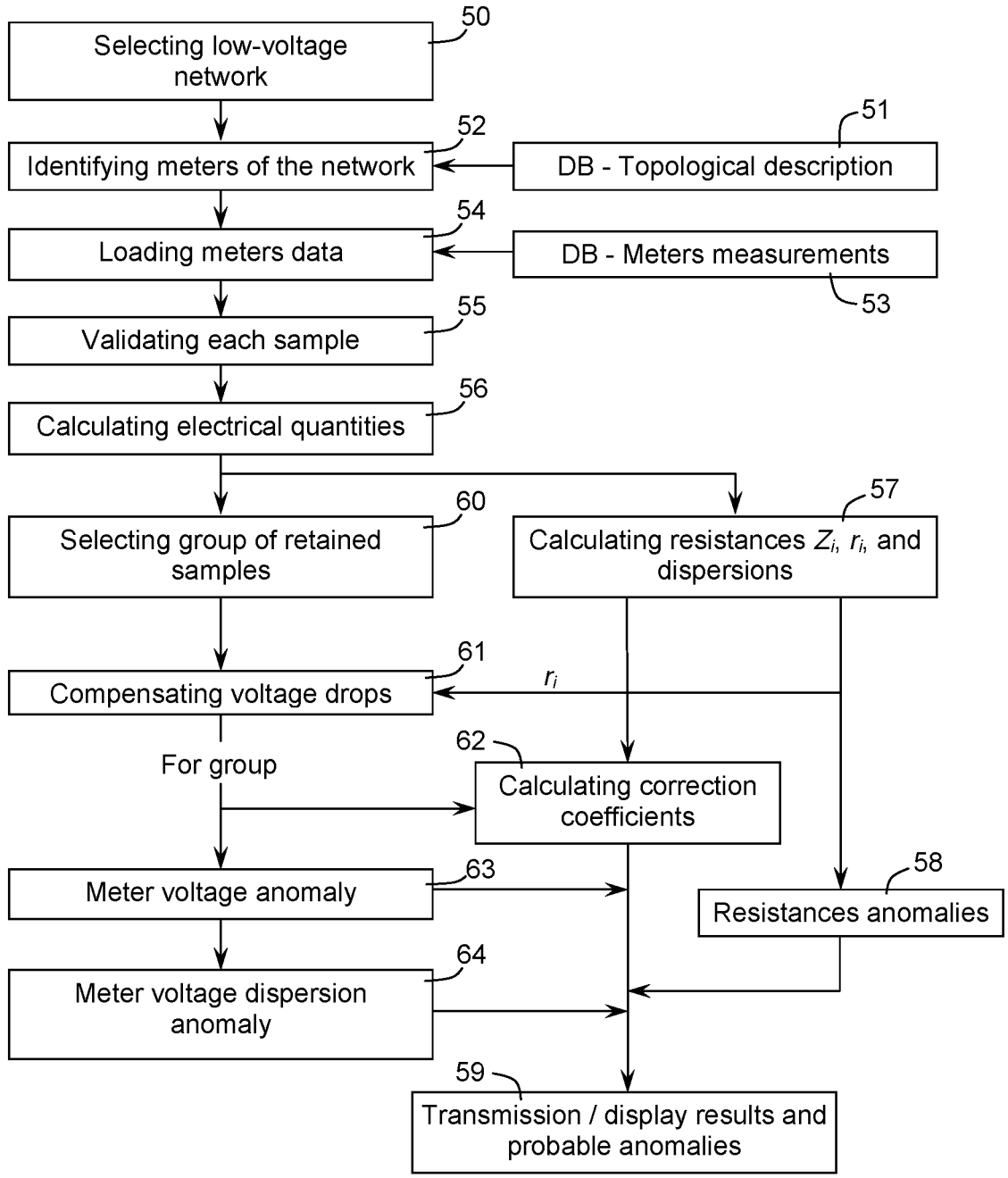
FIG. 16 is a flowchart illustrating an information flow and a connectivity between the main steps of the method.

—: without or with little impact
A: random or outlier
↑: increase or positive deviation
↓: decrease or negative deviation Referring to FIG. 16, there is shown a preferred embodiment of the method according to the invention. As depicted by block 50, the method starts with the selection of a low-voltage network performed manually or automatically. As depicted by block 51, the database 301 (shown in FIG. 17) containing a topological description of the network is queried for identifying the meters connected to the selected network as depicted by block 52. As depicted by block 53, from the identified meters, the database 301 containing an history of the meter measurements is queried for storing in memory 304 (shown in FIG. 17) the measurements/data of the meters connected to the selected network, as depicted by block 54. As depicted by block 55, a step of validating each sample uses the voltage measurement to detect blackouts and exclude the samples corresponding and adjoining to the blackouts, the result retained at the end of the rejection of certain candidates being the validated samples 100 (as shown in FIG. 4). The samples corresponding to outliers, such as those giving off-specification values of voltage or current, may also be excluded from the subsequent processings at step 55. As depicted by block 56, for each sample, electrical quantities as the current of each meter, the sum of the currents of the meters, the variations of voltage and of current with the previous sample, and the average voltage are calculated. These calculations may be carried out at once or, for some of these calculations, later, before the result is required in a subsequent calculation. As depicted by block 57, a calculation of the network resistance and of the connection resistance of each meter and of their dispersion is performed (eq. 13, 17a, 23a, 23b) from all the available data or a subset. As depicted by block 58, anomalies of resistance and of resistance dispersion are detected for the network resistance and the connection resistance. At this step, an overrun of a threshold based on the standard deviation and the average of the group of values forms one of the plausible samples. A preferred technique for controlling the network resistance value is to set the minimum value of the network resistance to that measured on the low-voltage transformer secondary and the maximum value to "x" times that observed on average on the targeted network or on the neighboring networks. A preferred technique for controlling the connection resistance value is to set the minimum connection resistance value to zero and the maximum value to 50 mΩ. As depicted by block 58, the meters exhibiting value outliers or dispersion outliers of their network resistance or of their connection resistance are identified and, as depicted by block 59, reported. As depicted by block 60, the step of selecting a group of samples corresponding to a low load carried by the network forms a particular aspect of the method. A preferred embodiment of step 60 is detailed in FIG. 4 and results in a group of retained samples as depicted by block 107. As depicted by block 61, a step of compensating the voltage drops generated by the low load-flows forms an optional second order correction allowing compensating for the voltage drop in the connection of each meter as a function of its connection resistance and its load-flow. As depicted by block 62, a calculation of the correction coefficients $\alpha_i$ is performed from the samples of the group selected at block 61 and this with (eq. 21) or without (eq. 11) the voltage correction subtracted from the connection resistance (eq. 17a) calculated at block 57 and the current. The consumption measurements can thus be adapted through steps 61 and 62. The values $\alpha_i$ are transmitted to the step 59 of transmission/display of the results and probable anomalies. As depicted by blocks 63 and 64, likewise, the detected meter voltage and meter voltage dispersion anomalies are transmitted to step 59. The voltage anomalies (block 63) may be detected by operations involving calculating an average voltage per meter, calculating thresholds corresponding to the voltage measurement precision deviations, and searching for the meters having their average voltage outside the precision thresholds. The voltage dispersion anomalies (block 64) may be detected by operations involving calculating the instantaneous voltage dispersion observed on each meter, calculating the dispersion on this dispersion, and searching for meters having their voltage dispersion abnormally distant from the group.

Figure 17:
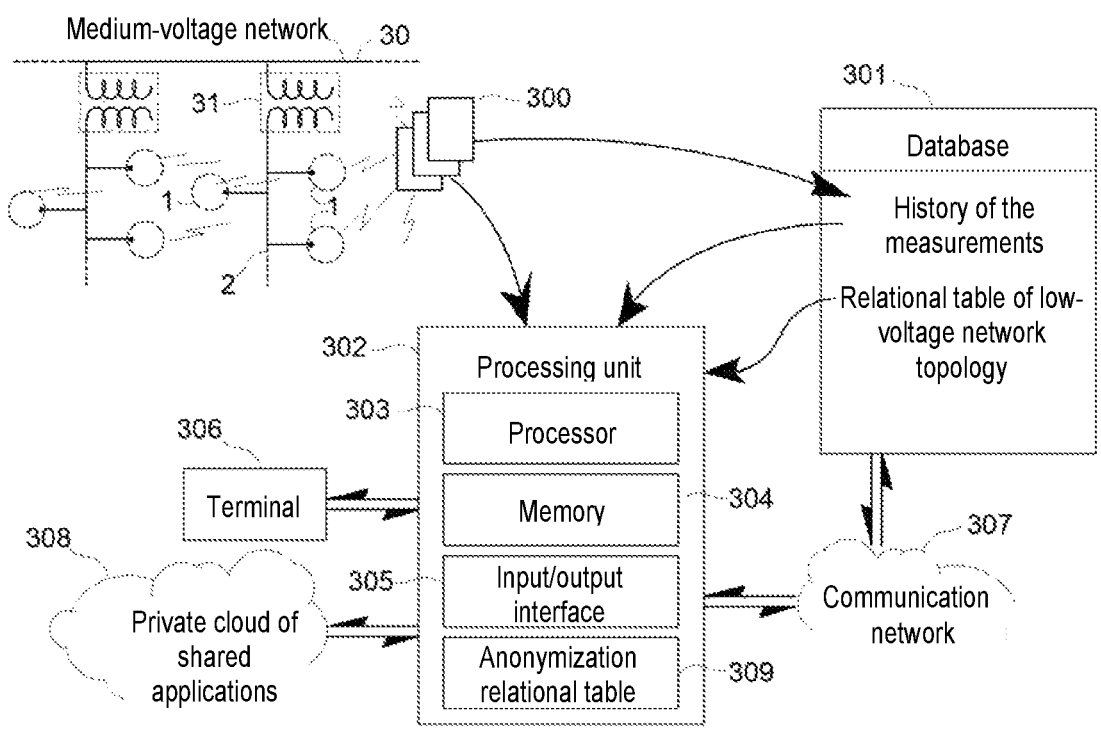
FIG. 17 is a schematic diagram illustrating an example of system that can implement the method according to the invention.

Referring to FIG. 17, there is shown a system able to implement the method according to the invention. According to a physical arrangement of connectivity intended to execute the method, a communication network 300 receives consumption measurements from smart meters 1 connected to a low-voltage network itself connected to a medium-voltage line 30 by a transformer 31. The communication network 300 may comprise communication equipments that may be provided with a memory temporarily storing the meter measurement data to be transmitted. A processing unit 302, comprising a processor 303, a memory 304, an input/output interface 305 and a relational table for data anonymization 309 receives the meter voltage data from the communication network 300 or from a database 301 that can store meter measurement histories and relational tables defining a topology of the network. Instructions defining operations to be executed by the processor 303 to implement the method according to the invention may be loaded in the memory 304 of the processing unit 302. The history of the voltages stored in the database 301 may have been generated and stored therein by the network 300 and/or by the processing unit 302. The processing unit 302 may be configured by a terminal 306 connected to it or by another equipment via a communication network 307 connected to the input/output interface 305. The method may be started manually by a user for example through the terminal 306 or by a configuration comprising among other things a time interval between two automatic executions of the method. Other applications may, via the communication network 307, read or modify the database 301 and more particularly the relational tables stored therein. Other applications may configure the processing unit 302 via the communication network 307 connected to the input/output interface 305 for example to set certain settings or use programmed functions useful for the method according to the invention. The processing unit 302 may start the application/execution of the preferred steps of the method as detailed in FIG. 16 by the selection of a low-voltage network to be tested and the queries of the meter histories relating to the selected network. Further processing may be performed in the processing unit 302 or in a private cloud of shared applications 308 storing instructions for performing the method or a part of the method. In the latter case, the data transmitted to the processing unit 302 in the private cloud 308 are preferably anonymized, for example by creating a relational table linking client identifiers to anonymous identifiers of the meters 1 as well as an identifier of the low-voltage network 2 and an identifier of the medium-voltage network 30. The results of the method may be used by other methods or applications implemented in the processing unit 302 or in the private cloud 308, or transmitted for display to the terminal 306 or transmitted to any other system connected via the communication network 307. The display at the terminal 306 or on any other device may take the form of graphic representations similar to those illustrated in FIGS. 2, 3, 5, 6, 7, 8, 9, 10, 11, 12, 13, 14A, 14B, 15A, 15B and 15C allowing viewing the results of the method and detecting ENCs.

Although the method according to the invention described above refers to several equations, it should be understood that the equations in question describe and define algorithms or forms of algorithms which, when implemented in and by a computer or a computer system, form a concrete embodiment of the invention. While embodiments of the invention have been illustrated in the accompanying drawings and described above, it will be evident to those skilled in the art that modifications may be made therein without departing from the invention.

Annex 1—

Demonstration that a systematic voltage deviation "e" is eliminated in the calculation proposed in equation 9.

$$\sum_{m=1}^{M}(e + v_{i,m} - \overline{v}_m)^2 - \frac{1}{M}\left(\sum_{m=1}^{M}(e + v_{i,m} - \overline{v}_m)\right)^2$$

$$\sum_{m=1}^{M}((v_{i,m} - \overline{v}_m)^2 + 2e \cdot (v_{i,m} - \overline{v}_m) + e^2) - \frac{1}{M}\left(M \cdot e + \sum_{m=1}^{M}(v_{i,m} - \overline{v}_m)\right)^2$$

Since $$\overline{v}_i = \frac{1}{M} \cdot \sum_{m=1}^{M} v_{i,m}$$

Then $$\sum_{m=1}^{M}(v_{i,m} - \overline{v}_m)^2 + 2M \cdot e\overline{v}_i - 2M \cdot e\overline{v}_m + M \cdot e^2 -$$

$$M \cdot e^2 - 2e\sum_{m=1}^{M}(v_{i,m} - \overline{v}_m) - \frac{1}{M}\left(\sum_{m=1}^{M}(v_{i,m} - \overline{v}_m)\right)^2$$

$$\sum_{m=1}^{M}(v_{i,m} - \overline{v}_m)^2 + 2M \cdot e\overline{v}_i - 2M \cdot e\overline{v}_m -$$

$$2M \cdot e\overline{v}_i + 2M \cdot e\overline{v}_m - \frac{1}{M}\left(\sum_{m=1}^{M}(v_{i,m} - \overline{v}_m)\right)^2$$

$$\sum_{m=1}^{M}(v_{i,m} - \overline{v}_m)^2 - \frac{1}{M}\left(\sum_{m=1}^{M}(v_{i,m} - \overline{v}_m)\right)^2$$

The invention claimed is:

1. A method for correcting, by a processor with a memory, consumption measurements taken at time intervals by a set of meters presumed to be connected to a same network, the method comprising the steps of:
   (i) collecting the consumption measurements and storing them in the memory in a form of a set of samples time-classified according to the time intervals of taking the consumption measurements by the meters;
   (ii) validating, by the processor, the samples in memory according to predetermined validation criteria;
   (iii) determining, by the processor, electrical quantities in relation with currents and voltages respectively relating to the meters for each time interval from the samples considered to be valid;
   (iv) selecting, by the processor, a group of retained samples among the samples considered to be valid, that correspond to a load range or a range of load variation ratio carried by the network based on the electrical quantities determined in (iii);

(v) defining, by the processor, correction functions of the consumption measurements from the grGup of retained samples selected in (iv); and (vi) adapting, by the processor, the consumption measurements according to the correction functions detined in (v), correcting the consumption measurements by the correction functions.

2. The method according to claim 1, wherein the load range is determined with respect to a percentage or a number of samples required for forming the group of retained samples.

3. The method according to claim 2, further comprising the steps of counting a set of samples considered to be valid whose total load is below or equal to a predefined threshold, and iteratively increasing the threshold until the percentage or the number of samples is reached or exceeded.

4. The method according to claim 1, wherein the correction functions comprise corrections of systematic voltage errors of the meters as a function of correction coefficients in relation with voltage averages observed at the meters calculated with the samples of the group of retained samples, and instantaneous average voltages observed on all the meters calculated with the consumption measurements collected in (i).

5. The method according to claim 1, wherein the correction functions comprise corrections of voltage drops generated by load currents carried by the meters.

6. The method according to claim 5, wherein the corrections of voltage drops comprise calculations of quantities of network resistance seen by each meter or of connection resistance of each meter to the network, or of total resistance for each meter.

7. The method according to claim 6, further comprising the step of detecting an electrical non-compliance related to a targeted meter among the meters when one of the quantities calculated for the targeted meter is below a predetermined minimum threshold or above a predetermined maximum threshold, or a dispersion of the quantities of one of the resistances of the targeted meter exceeds a predetermined threshold.

8. The method according to claim 6, wherein the quantity of network resistance seen by a targeted meter among the meters is estimated as a function of quantities in relation with instantaneous average voltages and currents in order to represent voltage drops observed by the other meters by excluding the targeted meter.

9. The method according to claim 6, wherein the quantity of connection resistance of a targeted meter among the meters is estimated as a function of a quantity of voltage at the targeted meter, of an average voltage estimated with the voltages of all the meters, and of a load at the targeted meter according to the consumption measurements collected in (i).

10. The method according to claim 6, further comprising the step of comparing the quantities of connection resistances of the meters to one another according to predetermined comparison criteria for detecting an electrical non-compliance of one or several of the meters.

11. The method according to claim 6, wherein the quantities of resistance in relation with a targeted meter are calculated from a subset of samples where the targeted meter exhibits derivatives of current substantially higher with respect to a quadratic sum of derivatives of current of the other meters.

12. The method according to claim 5, further comprising the step of calculating a standard deviation characterizing a dispersion in relation with an instantaneous voltage on each meter from the samples of the group of retained samples in (iv), with regard to an instantaneous average voltage observed on all the meters from a corrected voltage measurements.

13. The method according to claim 4, further comprising the step of detecting an electrical non-compliance related to a targeted meter when the correction coefficient or an average deviation in relation with voltage quantities of the targeted meter exceeds a predetermined quantity.

14. The method according to claim 1, wherein the load range is determined with respect to sums of electrical quantities or maximum electrical quantities comprised in the electrical quantities determined in (iii).

15. The method according to claim 1, wherein the electrical quantities comprise time-series of discrete derivatives on the currents and voltages relating to the meters.

16. The method according to claim 1, further comprising the step of determining, by the processor, no-load average voltage values for each meter from the electrical quantities determined in (iii), the correction functions being defined with respect to the no-load average voltage values.

17. The method according to claim 16, further comprising the step of detecting an outlier in the consumption measurements with respect to the correction functions defined in (v).

18. A system for correcting consumption measurements provided by meters presumed to be connected to a same network, the system comprising a processing unit having a processor and a memory in communication with the processor, the memory containing instructions that, when executed by the processor, cause the processor to perform the steps of:

(i) collecting the consumption measurements and storing them in the memory in a form of a set of samples time-classified according to a time intervals of taking the consumption measurements by the meters:

(ii) validating, by the processor, the samples in memory according to predetermined validation criteria;

(iii) determining, by the processor, electrical quantities in relation with currents and voltages respectively relating to the meters for each time interval from the samples considered to be valid;

(iv) selecting, by the processor, a group of retained samples among the samples considered to be valid, that correspond to a load range or a range of load variation ratio carried by the network based on the electrical quantities determined in (iii);

(v) defining, by the processor, correction functions of the consumption measurements from the group of retained samples selected in (iv); and (vi) adapting, by the processor, the consumption measurements according to the correction functions defined in (v), correcting the consumption measurements by the correction functions.

19. The system according to claim 18, further comprising:

a communication network for transmitting the consumption measurements taken by the meters; and a database unit connected to the communication network, for storing the consumption measurements and data indicative of a topology of the network to which the meters are presumed to be connected;

and wherein:

the processing unit is connected to the communication network and to the database unit;

the consumption measurements are obtained via the communication network from the meters or the database unit; and the instructions further cause the processor to perform a step of updating the consumption measurements of the meters according to the consumption measurements adapted in (vi).

20. The system according to claim 19, further comprising a terminal for configuring the processing unit, and wherein the processing unit further comprises an input/output interface and a data anonymization unit for exchanging data with cloud applications.

\* \* \* \* \*